(12) United States Patent
Gohira et al.

(10) Patent No.: US 10,304,691 B2
(45) Date of Patent: May 28, 2019

(54) METHOD OF ETCHING SILICON OXIDE AND SILICON NITRIDE SELECTIVELY AGAINST EACH OTHER

(71) Applicant: Tokyo Electron Limited, Tokyo (JP)

(72) Inventors: Taku Gohira, Miyagi (JP); Sho Tominaga, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 3 days.

(21) Appl. No.: 15/702,898

(22) Filed: Sep. 13, 2017

(65) Prior Publication Data
US 2018/0076048 A1 Mar. 15, 2018

(30) Foreign Application Priority Data
Sep. 15, 2016 (JP) ................. 2016-180582

(51) Int. Cl.
| H01L 21/311 | (2006.01) |
| H01L 21/02 | (2006.01) |
| H01L 21/66 | (2006.01) |
| H01J 37/32 | (2006.01) |
| H01L 21/67 | (2006.01) |
| H01L 21/683 | (2006.01) |

(52) U.S. Cl.
CPC .. *H01L 21/31116* (2013.01); *H01J 37/32724* (2013.01); *H01L 21/022* (2013.01); *H01L 21/0217* (2013.01); *H01L 21/02164* (2013.01); *H01L 21/67069* (2013.01); *H01L 21/67103* (2013.01); *H01L 21/67109* (2013.01); *H01L 21/67248* (2013.01); *H01L 21/6831* (2013.01); *H01L 21/6833* (2013.01); *H01L 22/26* (2013.01); *H01J 37/32165* (2013.01)

(58) Field of Classification Search
None
See application file for complete search history.

(56) References Cited

U.S. PATENT DOCUMENTS

| 5,980,767 | A | * | 11/1999 | Koshimizu | ......... B81C 1/00587 216/60 |
| 6,635,185 | B2 | * | 10/2003 | Demmin | ........... H01L 21/30604 216/64 |
| 2012/0001264 | A1 | * | 1/2012 | Kim | ...................... C09K 13/04 257/368 |

(Continued)

FOREIGN PATENT DOCUMENTS

JP 07-147273 A 6/1995

*Primary Examiner* — Shamim Ahmed
(74) *Attorney, Agent, or Firm* — Pearne & Gordon LLP

(57) ABSTRACT

Silicon oxide and silicon nitride can be etched selectively against each other with high efficiency. A method includes preparing a processing target object within a chamber; etching the silicon oxide of the processing target object by generating plasma of a processing gas containing carbon, hydrogen and fluorine within the chamber in a state that a temperature of the processing target object is set to a first temperature; and etching the silicon nitride of the processing target object by generating the plasma of the processing gas containing carbon, hydrogen and fluorine within the chamber in a state that the temperature of the processing target object is set to a second temperature higher than the first temperature.

5 Claims, 14 Drawing Sheets

(56) References Cited

U.S. PATENT DOCUMENTS

2014/0335697 A1* 11/2014 Indrakanti ......... H01L 21/76811
438/714
2015/0357200 A1* 12/2015 Inui ................... H01L 21/31116
438/706
2017/0338160 A1* 11/2017 Kabouzi ................ H01L 22/26

* cited by examiner

METHOD OF ETCHING SILICON OXIDE AND SILICON NITRIDE SELECTIVELY AGAINST EACH OTHER

CROSS-REFERENCE TO RELATED APPLICATION

This application claims the benefit of Japanese Patent Application No. 2016-180582 filed on Sep. 15, 2016, the entire disclosures of which are incorporated herein by reference.

TECHNICAL FIELD

The embodiments described herein pertain generally to an etching method; and, more particularly, to a method of etching silicon oxide and silicon nitride selectively against each other.

BACKGROUND

In the manufacture of an electronic device such as a semiconductor device, plasma etching may be performed by using a plasma processing apparatus. When performing the plasma etching, plasma of a processing gas is generated within a chamber main body of the plasma processing apparatus. An etching target region of a processing target object is etched by ions and/or radicals in the generated plasma.

An example of the etching target region may be a region made of silicon oxide. In the plasma etching of the silicon oxide, plasma of a processing gas containing fluorocarbon and/or hydrofluorocarbon is generated. Such plasma etching of the silicon oxide is described in Patent Document 1.

Patent Document 1: Japanese Patent Laid-open Publication No. H07-147273

Meanwhile, a processing target object may have a region made of silicon oxide and a region made of silicon nitride. In the plasma etching of such a processing target object, it may be required to etch the silicon oxide and the silicon nitride selectively against each other. Further, in this etching of the silicon oxide and the silicon nitride, it is also required to etch them efficiently.

SUMMARY

In an exemplary embodiment, there is provided a method of etching silicon oxide and silicon nitride selectively against each other. The method includes (i) preparing a processing target object within a chamber provided by a chamber main body of a plasma processing apparatus; (ii) etching silicon oxide of the processing target object by generating plasma of a processing gas containing carbon, hydrogen and fluorine within the chamber in a state that a temperature of the processing target object is set to a first temperature; and (iii) etching silicon nitride of the processing target object by generating the plasma of the processing gas containing carbon, hydrogen and fluorine within the chamber in a state that the temperature of the processing target object is set to a second temperature higher than the first temperature.

An etching rate of the silicon oxide becomes higher than an etching rate of the silicon nitride at a relatively low temperature. Meanwhile, the etching rate of the silicon nitride becomes higher than the etching rate of the silicon oxide at a relatively high temperature. In the exemplary embodiment, the etching is performed by the plasma of the processing gas in the state that the temperature of the processing target object is set to the first temperature which is relatively low. Accordingly, the silicon oxide is etched selectively with high efficiency against the silicon nitride. Furthermore, the etching is performed by the plasma of the processing gas in the state that the temperature of the processing target object is set to the second temperature which is higher than the first temperature. Accordingly, the silicon nitride is etched selectively with high efficiency against the silicon oxide. Therefore, according to the method, it is possible to etch the silicon oxide and the silicon nitride selectively against each other with high efficiency.

The processing target object may have multiple first layers made of the silicon oxide and multiple second layers made of the silicon nitride. The multiple first layers and the multiple second layers may be alternately stacked on top of each other. The etching of the silicon oxide and the etching of the silicon nitride may be performed alternately. In this exemplary embodiment, the multilayered film can be efficiently etched.

The first temperature may be lower than −30° C., and the second temperature may be higher than −30° C.

The plasma processing apparatus may further include an analyzer configured to perform spectroscopic analysis of the plasma within the chamber. The etching of the silicon oxide may be ended when it is determined, based on a light emission intensity of CO obtained by the analyzer, that the silicon oxide is completely etched. Further, the etching of the silicon nitride may be ended when it is determined, based on a light emission intensity of CN obtained by the analyzer, that the silicon nitride is completely etched.

The plasma processing apparatus may further include a mounting table, a chiller unit, a gas exhaust device and a pipeline system. The mounting table may be provided within the chamber and include a cooling table made of a metal and an electrostatic chuck. A path for a coolant may be provided within the cooling table. The electrostatic chuck may be provided on the cooling table with a heat transfer space therebetween and provided with a heater therein. The chiller unit may be configured to supply the coolant into the path of the cooling table. The pipeline system may be configured to connect the chiller unit and the gas exhaust device to the heat transfer space selectively. The method may further include decreasing the temperature of the processing target object by supplying the coolant into the path and the heat transfer space from the chiller unit; and increasing the temperature of the processing target object by decompressing the heat transfer space with the gas exhaust device and generating heat from the heater. The etching of the silicon oxide may be performed after the temperature of the processing target object is set to the first temperature by performing the decreasing of the temperature of the processing target object. Further, the etching of the silicon nitride may be performed after the temperature of the processing target object is set to the second temperature by performing the increasing of the temperature of the processing target object. If the coolant is supplied into the heat transfer space, the heat resistance between the electrostatic chuck and the cooling table is reduced, so that the temperature of the electrostatic chuck can be reduced at a high speed. Accordingly, before the etching of the silicon oxide is performed, the temperature of the processing target object can be reduced at a high speed. Further, if the heat transfer space is decompressed, the heat resistance between the electrostatic chuck and the cooling table is increased, so that the temperature of the electrostatic chuck can be increased at a high speed. Accordingly, before the etching of the silicon nitride is performed, the temperature of the processing target object can be increased at a high speed. Thus, according to the exemplary embodiment, the silicon oxide and the silicon nitride can be etched selectively against each other with high efficiency.

According to the exemplary embodiments as described above, it is possible to etch the silicon oxide and the silicon nitride selectively against each other with high efficiency.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
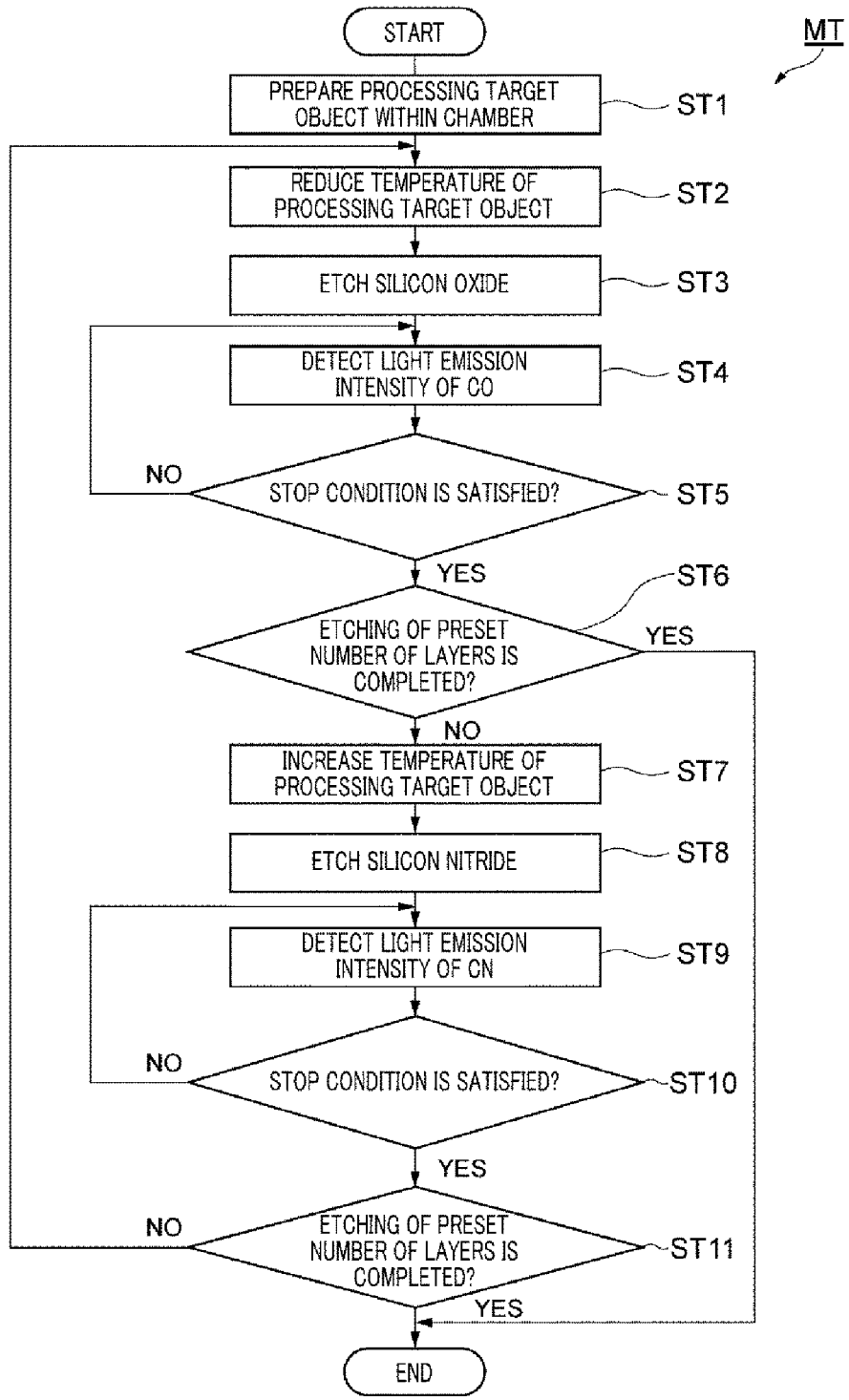
FIG. 1 is a flowchart for describing a method of etching silicon oxide and silicon nitride selectively against each other according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. Same or corresponding parts in the various drawings will be assigned same reference numerals.

FIG. 1 is a flowchart for describing a method according to an exemplary embodiment. A method MT shown in FIG. 1 is directed to etching silicon oxide and silicon nitride of a processing target object selectively against each other. In the method shown in FIG. 1, a process ST1 is first performed. In the process ST1, a processing target object is prepared in a chamber of a plasma processing apparatus.

Figure 2:
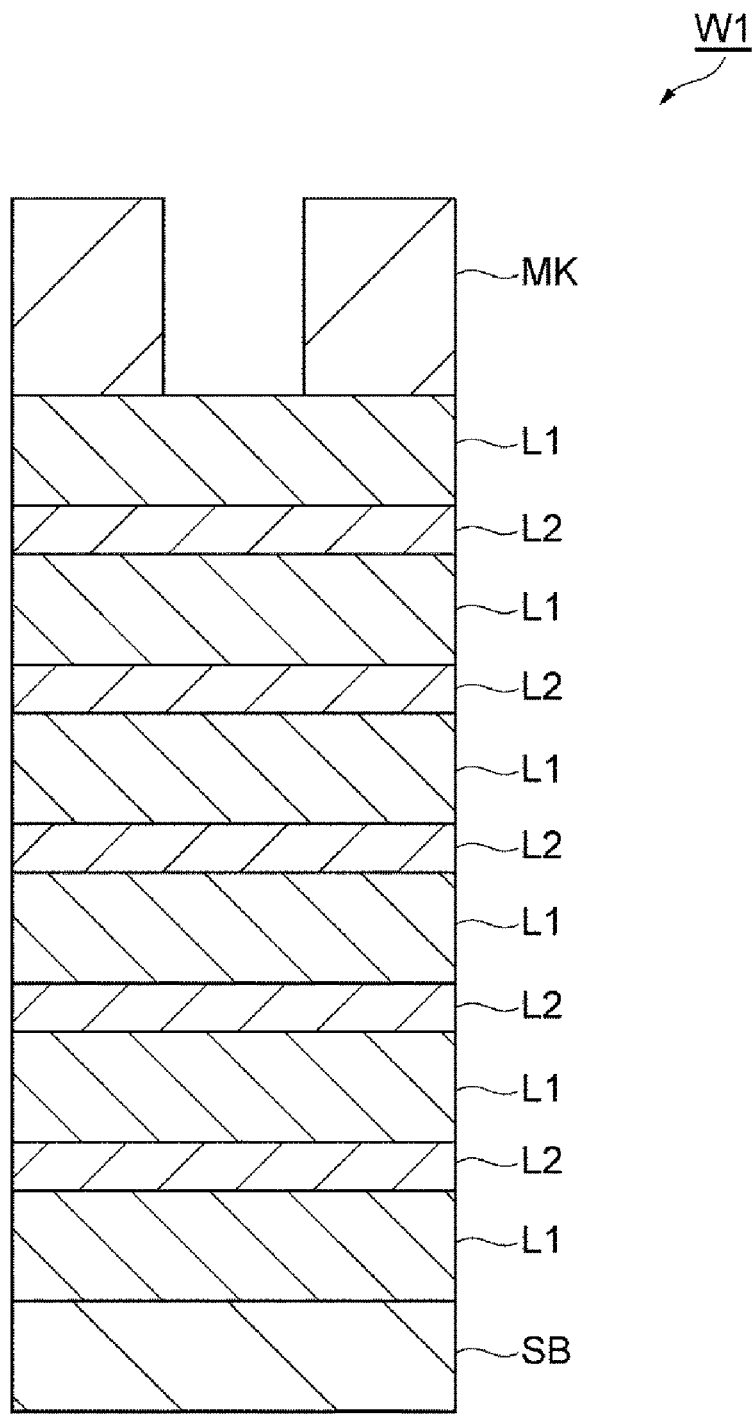
FIG. 2 is an enlarged sectional view illustrating a part of an example processing target object.

FIG. 2 is an enlarged sectional view illustrating a part of an example processing target object. An example processing target object W1 shown in FIG. 2 has a plurality of first layers L1 and a multiplicity of second layers L2. The first layers L1 are made of silicon oxide. The second layers L2 are made of silicon nitride. The first layers L1 and the second layers L2 are alternately stacked on top of each other on a substrate SB. That is, the processing target object W1 has a multilayered film composed of the layers made of silicon oxide and the layers made of silicon nitride. A mask MK is provided on top of the uppermost layer of the multilayered film. The processing target object W1 may have, for example, a disk shape. The mask MK of the processing target object W1 is provided with multiple openings distributed in a surface thereof. The openings of the mask MK are, by way of example, holes or grooves. Further, the processing target object to which the method MT is applied may not necessarily have the multilayered film as long as the processing target object has one or more first regions made of silicon oxide and one or more second regions made of silicon nitride. Further, the one or more first regions and the one or more second regions may not be stacked on top of each other.

Figure 3:
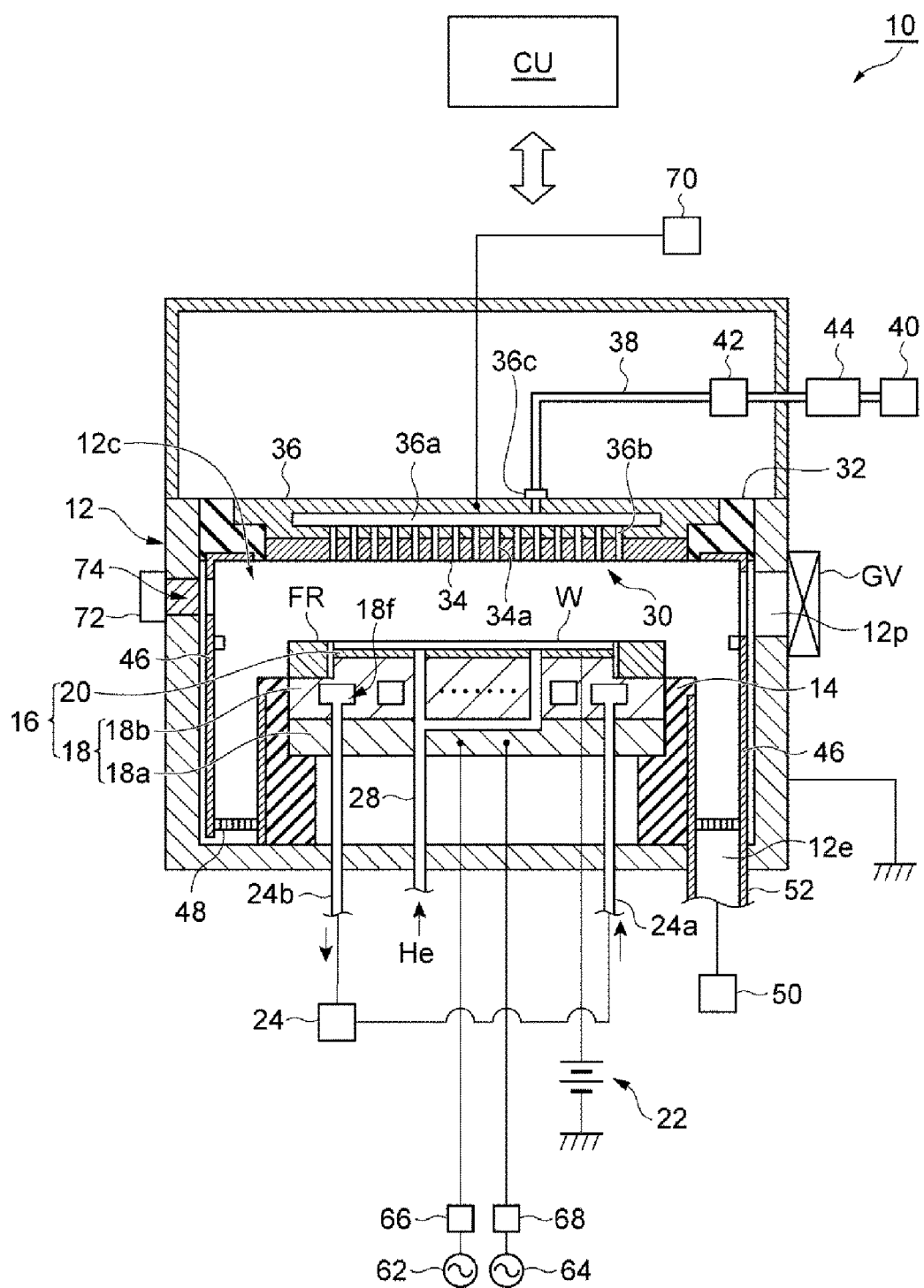
FIG. 3 is a diagram schematically illustrating a plasma processing apparatus according to the exemplary embodiment that can be used to perform the method shown FIG. 1.

FIG. 3 is a diagram illustrating a plasma processing apparatus according to the exemplary embodiment that can be used in performing the method shown in FIG. 1. A plasma processing apparatus 10 shown in FIG. 3 is configured as a capacitively coupled plasma processing apparatus. The plasma processing apparatus 10 includes a chamber main body 12. The chamber main body 12 has a substantially cylindrical shape, and an internal space of the chamber main body 12 is configured as a chamber 12c. The chamber main body 12 is made of a metal such as, but not limited to, aluminum. A film having plasma resistance, for example, an alumite film or an yttrium oxide film is formed on an inner wall surface of the chamber main body 12. The chamber main body 12 is grounded.

Within the chamber 12c, a supporting member 14 is provided on a bottom portion of the chamber main body 12. The supporting member 14 is made of an insulating material.

The supporting member 14 has a substantially cylindrical shape. Within the chamber 12c, the supporting member 14 is upwardly extended from the bottom portion of the chamber main body 12. The supporting member 14 is configured to support a mounting table 16 on an upper portion thereof.

The mounting table 16 includes a lower electrode 18 and an electrostatic chuck 20. The lower electrode 18 includes a first member 18a and a second member 18b. The first member 18a and the second member 18b are made of a conductor such as, but not limited to, aluminum, and each has a substantially disk shape. The second member 18b is provided on the first member 18a and electrically connected with the first member 18a. The electrostatic chuck 20 is provided on the lower electrode 18.

The electrostatic chuck 20 is configured to hold a processing target object W placed thereon. The electrostatic chuck 20 has a disk-shaped insulating layer and a film-shaped electrode embedded in the insulating layer. The electrode of the electrostatic chuck 20 is electrically connected to a DC power supply 22. The electrostatic chuck 20 attracts and holds the processing target object W by an electrostatic force generated by a DC voltage applied from the DC power supply 22. A heater may be provided within this electrostatic chuck 20.

A focus ring FR is provided on a peripheral portion of the lower electrode 18 to surround an edge of the processing target object W and the electrostatic chuck 20. The focus ring FR is provided to improve uniformity of etching. The focus ring FR is made of a material which is appropriately selected depending on a material of the etching target. By way of non-limiting example, the focus ring FR may be made of quartz.

A path 18f for a coolant is formed in the second member 18b of the lower electrode 18. A coolant is supplied into the path 18f from a chiller unit 24 provided outside the chamber main body 12 via a pipeline 24a. The coolant supplied into the path 18f is returned back into the chiller unit 24 through a pipeline 24b. The chiller unit 24 is configured to control a temperature of the coolant supplied into the path 18f. As the temperature of the coolant supplied into the path 18f is controlled, a temperature of the processing target object W placed on the electrostatic chuck 20 is controlled.

The plasma processing apparatus 10 is equipped with a gas supply line 28. Through the gas supply line 28, a heat transfer gas, for example, a He gas, is supplied from a heat transfer gas supply device into a gap between a top surface of the electrostatic chuck 20 and a rear surface of the processing target object W.

The plasma processing apparatus 10 is further equipped with an upper electrode 30. The upper electrode 30 is placed above the mounting table 16, facing the mounting table 16. The upper electrode 30 is supported at an upper portion of the chamber main body 12 with an insulating member 32 therebetween. The upper electrode 30 may include a ceiling plate 34 and a supporting body 36. The ceiling plate 34 is directly contact with the chamber 12c, and is provided with a multiple number of gas discharge holes 34a. This ceiling plate 34 may be made of a conductor or a semiconductor having low resistance with low Joule heat.

The supporting body 36 is configured to support the ceiling plate 34 in a detachable manner, and is made of a conductor such as, but not limited to, aluminum. A gas diffusion space 36a is formed within the supporting body 36. Multiple holes 36b are extended downwards from the gas diffusion space 36a to communicate with the gas discharge holes 34a, respectively. Further, the supporting body 36 is provided with a port 36c through which a processing gas is introduced into the gas diffusion space 36a, and a pipeline 38 is connected to this port 36c.

The pipeline 38 is connected to a gas source group 40 via a valve group 42 and a flow rate controller group 44. The gas source group 40 includes a plurality of gas sources for supplying a processing gas containing carbon, hydrogen and fluorine into the chamber 12c. The plurality of gas sources at least includes a gas source of a hydrogen-containing gas and a gas source of a fluorine-containing gas. Here, the hydrogen-containing gas may be, by way of non-limiting example, a hydrogen gas ($H_2$ gas), a hydrocarbon gas or a hydrofluorocarbon gas. The fluorine-containing gas may be, by way of example, but not limitation, a fluorocarbon gas, a hydrofluorocarbon gas, a nitrogen trifluoride gas ($NF_3$ gas) or a sulfur hexafluoride gas ($SF_6$ gas). As an example, the plurality of gas sources may include a gas source of a $H_2$ gas, a gas source of a $CF_4$ gas, a gas source of a $CHF_3$ gas and a gas source of a $NF_3$ gas. As another example, the plurality of gas sources may include a gas source of a $H_2$ gas, a gas source of a $CF_4$ gas, a gas source of a $CH_2F_2$ gas and a gas source of a $NF_3$ gas.

The valve group 42 includes a plurality of valves, and the flow rate controller group 44 includes a plurality of flow rate controllers. Each of the flow rate controllers may be implemented by a mass flow controller or a pressure control type flow rate controller. Each of the gas sources belonging to the gas source group 40 is connected to the pipeline 38 via the corresponding flow rate controller belonging to the flow rate controller group 44 and the corresponding valve belonging to the valve group 42.

Further, in the plasma processing apparatus 10, a shield member 46 is provided along an inner wall of the chamber main body 12 in a detachable manner. The shield member 46 is also provided on an outer side surface of the supporting member 14. The shield member 46 is configured to suppress an etching byproduct from adhering to the chamber main body 12. The shield member 46 may be prepared by coating an aluminum member with ceramics such as $Y_2O_3$.

A baffle plate 48 is provided between the supporting member 14 and the inner wall of the chamber main body 12. The baffle plate 48 is provided with a plurality of holes which are formed through the baffle plate 48 in a thickness direction thereof. The baffle plate 48 may be made of, by way of example, an aluminum member coated with ceramics such as $Y_2O_3$. The chamber main body 12 is also provided with a gas exhaust opening 12e under the baffle plate 48. The gas exhaust opening 12e is connected with a gas exhaust device 50 via a gas exhaust line 52. The gas exhaust device 50 includes a vacuum pump such as a turbo molecular pump, and is capable of decompressing the chamber 12c. Further, an opening 12p for carry-in and carry-out of the processing target object W is provided at a side wall of the chamber main body 12, and the opening 12p is opened/closed by a gate valve GV.

The plasma processing apparatus 10 further includes a first high frequency power supply 62 and a second high frequency power supply 64. The first high frequency power supply 62 is configured to generate a first high frequency power for plasma generation. A frequency of the first high frequency power is in the range from 27 MHz to 100 MHz, for example, 40 MHz. The first high frequency power supply 62 is connected to the lower electrode 18 via a matching device 66. The matching device 66 is equipped with a circuit configured to match an output impedance of the first high frequency power supply 62 and an input impedance at a load side (lower electrode 18 side). The first high frequency power supply 62 may be connected to the upper electrode 30 via the matching device 66.

The second high frequency power supply 64 is configured to generate a second high frequency power for ion attraction into the processing target object W. A frequency of the second high frequency power ranges from 400 kHz to 13.56 MHz, for example, 3 MHz. The second high frequency power supply 64 is connected to the lower electrode 18 via a matching device 68. The matching device 68 is equipped with a circuit configured to match an output impedance of the second high frequency power supply 64 and the input impedance at the load side (lower electrode 18 side).

Further, the plasma processing apparatus 10 may further include a DC power supply 70. The DC power supply 70 is connected to the upper electrode 30. The DC power supply 70 is configured to generate a negative DC voltage to apply this negative DC voltage to the upper electrode 30.

The plasma processing apparatus 10 may be further equipped with an analyzer 72. The analyzer 72 is configured to perform spectroscopic analysis of plasma generated within the chamber 12c. By way of example, the analyzer 72 observes emission of plasma through a window 74 provided at the side wall of the chamber main body 12. The window 74 is made of a transparent material such as quartz. The analyzer 72 detects at least a light emission intensity of CO and a light emission intensity of CN. The emitted light of CO has a wavelength of about 483 nm, and the emitted light of CN has a wavelength of about 387 nm.

The plasma processing apparatus 10 may further include a control unit CU. The control unit CU is implemented by a computer including a processor, a storage unit, an input device, a display device, and so forth, and is configured to control individual components of the plasma processing apparatus 10. In the control unit CU, an operator can input commands through the input device to manage the plasma processing apparatus 10. Further, an operational status of the plasma processing apparatus 10 can be visually displayed on the display device. Further, the storage unit of the control unit CU stores therein recipe data and control programs for controlling various processings performed in the plasma processing apparatus 10 by the processor. For example, the storage unit of the control unit CU stores therein control programs for implementing the method MT in the plasma processing apparatus 10 and recipe data.

Now, the method MT will be explained for an example case where the method MT is applied to the processing target object W1 by using the plasma processing apparatus 10. Here, however, it should be noted that a plasma processing apparatus used to perform the method MT is not limited to the plasma processing apparatus 10 and a processing target object to which the method MT is applied is not limited to the processing target object W1.

Figure 4:
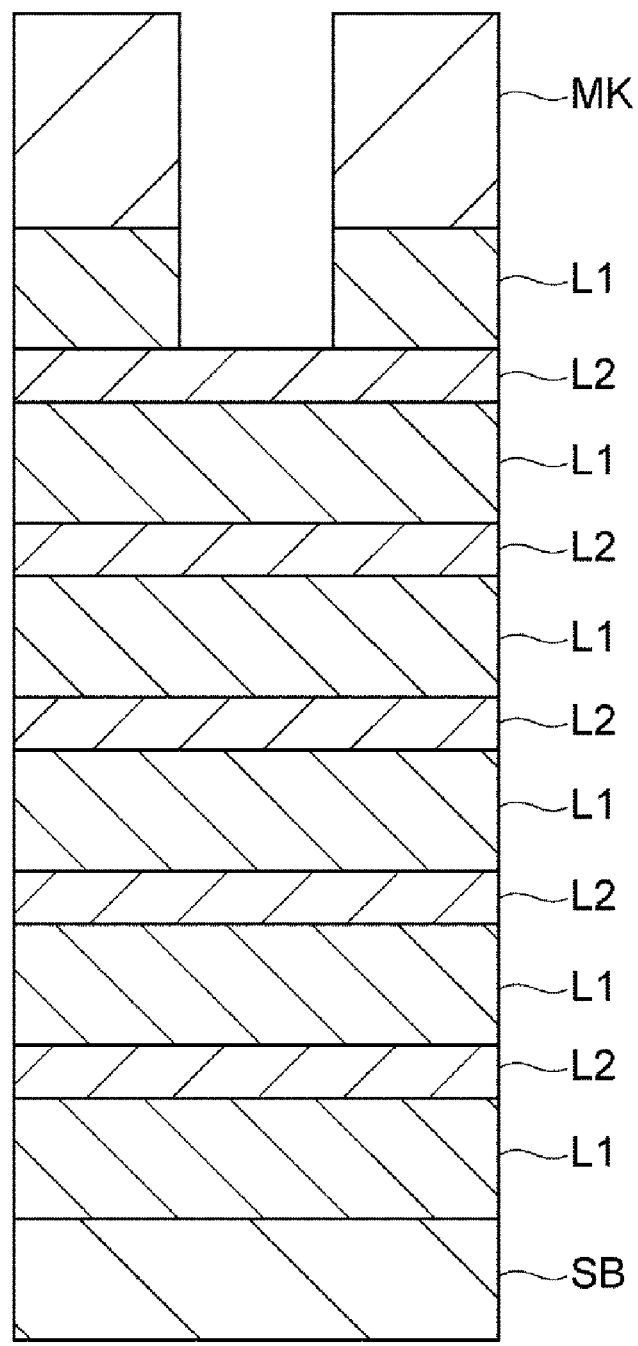
FIG. 4 is an enlarged sectional view illustrating a part of the processing target object at a time when the method MT is being performed.
Figure 5:
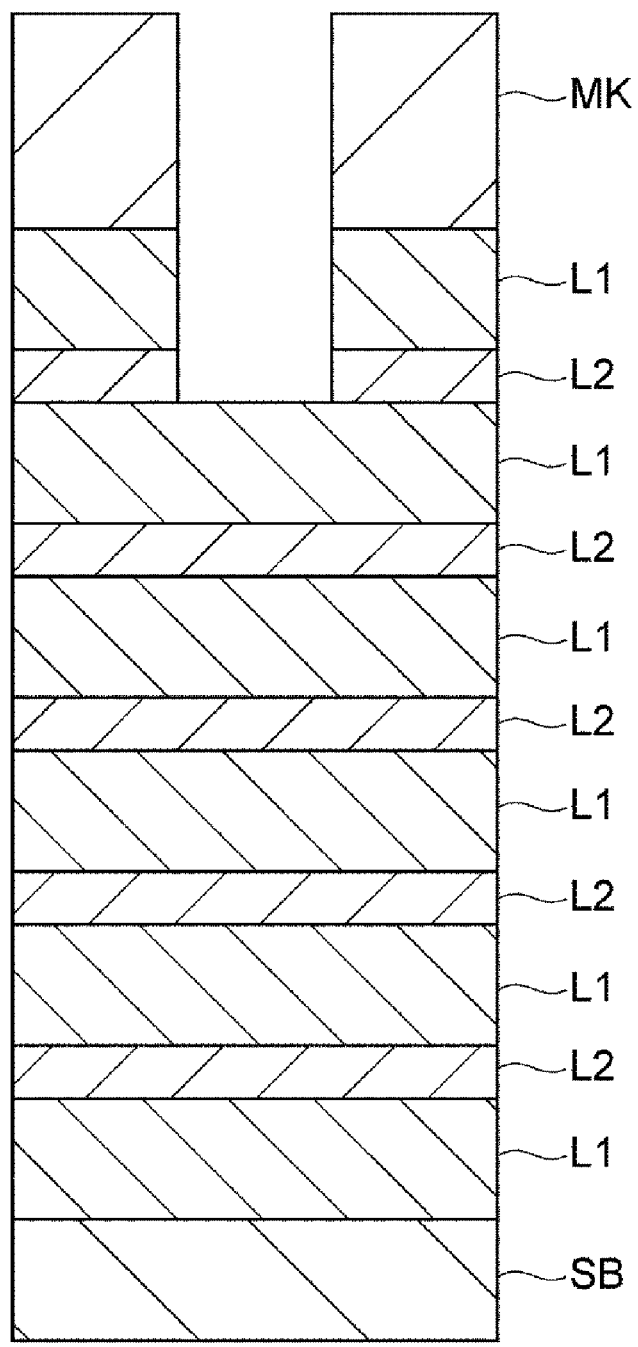
FIG. 5 is an enlarged sectional view illustrating a part of the processing target at a time when the method MT is being performed.
Figure 6:
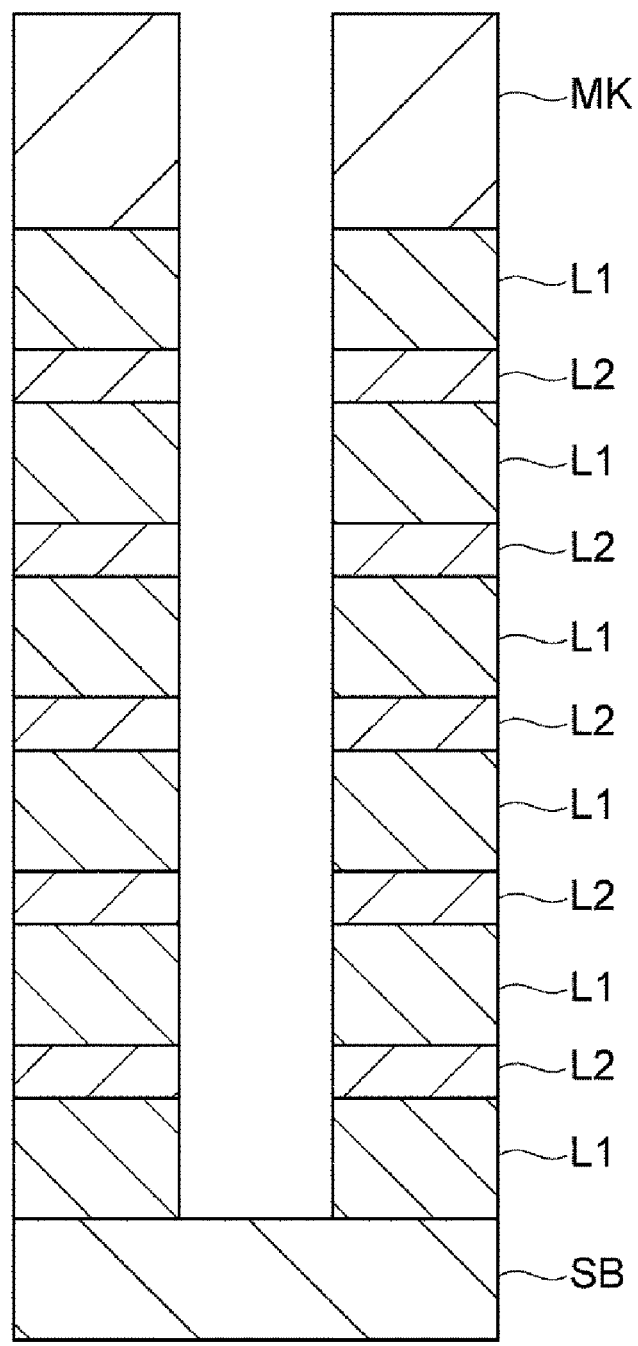
FIG. 6 is an enlarged sectional view illustrating a part of the processing target object at a time when the method MT is completed.

Reference is made to FIG. 1 again and FIG. 4 to FIG. 6 as well. FIG. 4 and FIG. 5 are enlarged sectional views illustrating a part of the processing target object at a time when the method MT is being performed. FIG. 6 is an enlarged sectional view illustrating a part of the processing target object at a time when the method MT is completed.

As stated above, in the process ST1 of the method MT, the processing target object W1 as shown in FIG. 2 is prepared within the chamber 12c. The processing target object W1 is placed on and held by the electrostatic chuck 20.

Then, a process ST2 is performed. In the process ST2, a temperature of the processing target object W1 is reduced. To elaborate, in response to a signal from the control unit CU, the chiller unit 24 adjusts the temperature of the coolant supplied to the path 18f. Accordingly, the temperature of the processing target object W1 is reduced to reach a first temperature. The first temperature is, for example, lower than −30° C.

Subsequently, a process ST3 is performed. In the process ST3, while the temperature of the processing target object W1 is set to the first temperature, the silicon oxide of the processing target object W1 is etched. In the process ST3, in response to a signal from the control unit CU, individual components of the plasma processing apparatus 10 is controlled. Accordingly, the processing gas containing carbon, hydrogen and fluorine is supplied into the chamber 12c. As an example, the processing gas may contain a $H_2$ gas, a $CF_4$ gas, a $CHF_3$ gas and a $NF_3$ gas. As another example, the processing gas may contain a $H_2$ gas, a $CF_4$ gas, a $CH_2F_2$ gas and a $NF_3$ gas. Further, in the process ST3, the chamber 12c is decompressed. Further, the temperature-adjusted coolant is supplied into the path 18f from the chiller unit 24 to maintain the processing target object W1 at the first temperature. Furthermore, the first high frequency power is supplied to the lower electrode 18 from the first high frequency power supply 62, and the second high frequency power may be supplied to the lower electrode 18 from the second high frequency power supply 64. By performing the process ST3, plasma of the processing gas is generated within the chamber 12c. The silicon oxide is etched by active species such as ions and/or radicals in this plasma. To elaborate, a portion of the first layer L1 exposed through an opening of the mask MK is etched.

Thereafter, a process ST4 is performed, and a process ST5 is then performed. The process ST4 and the process ST5 are conducted until the etching of the silicon oxide of the process ST3 is ended. In the process ST4, the light emission intensity of CO is detected by the analyzer 72. The detected light emission intensity is sent to the control unit CU.

In the process ST5, it is determined by the control unit CU whether a condition for stopping the process ST3 is satisfied. To be specific, in the process ST5, based on the light emission intensity of the CO detected in the process ST4, it is determined by the control unit CU whether the etching of the silicon oxide has been completed. During the process ST3, the CO is generated as the oxygen generated by the etching of the silicon oxide is bond with the carbon contained in the processing gas. The light emission intensity of the CO thus generated is reduced when the etching of the silicon oxide is ended. Thus, based on times series values of the light emission intensity of the CO, it can be determined whether the etching of the silicon oxide has been finished. For example, if the light emission intensity of the CO is decreased at a preset rate during the process ST3 or if an absolute value of a time derivative of the light emission intensity of the CO is increased over a preset value during the process ST3, it can be determined that the etching of the silicon oxide has been ended. Further, the process ST3 may be ended after a lapse of a predetermined time from the beginning thereof.

If it is determined in the process ST5 that the etching of the silicon oxide is not finished yet, the processing from the process ST4 is continued again while performing the process ST3. Meanwhile, if it is determined in the process ST5 that the etching of the silicon oxide has been ended, the process ST3 is ended. If a first cycle of the process ST3 is ended as the uppermost first layer L1 is etched, a second layer L2 under the uppermost first layer L1 is exposed through the opening of the mask MK, as illustrated in FIG. 4. Further, an etching rate of the silicon nitride is much lower than an etching rate of the silicon oxide at the temperature (first temperature) of the processing target object W1 during the process ST3. Accordingly, even when the etching of the first layer L1 is finished, the second layer L2 under the first layer L1 is hardly etched as compared to the first layer L1.

Subsequently, the process ST6 is conducted. In the process ST6, it is determined by the control unit CU whether the etching of a preset number of layers of the processing target object W1 has been ended. Here, the "preset number" may be the total number of all layers of the processing target object, or may be a number smaller than the total number of the layers. If it is determined in the process ST6 that the present number of layers are all etched, the method MT is ended. Meanwhile, if it is determined that the etching of the preset number of layers is not completed yet, the processing proceeds to a process ST7.

In the process ST7, the temperature of the processing target object W1 is increased. To elaborate, in response to a signal from the control unit CU, the chiller unit 24 adjusts the temperature of the coolant supplied to the path 18f. Further, in the process ST7, the heater embedded in the electrostatic chuck 20 may generate heat. As a result, the temperature of the processing target object W1 is raised to reach a second temperature. The second temperature is higher than the first temperature. By way of example, the second temperature may be higher than −30° C.

Then, a process ST8 is conducted. In the process ST8, etching of the silicon nitride of the processing target object W1 is performed in the state that the temperature of the processing target object W1 is set to the second temperature. In the process ST8, in response to a signal from the control unit CU, the individual components of the plasma processing apparatus 10 are controlled. Accordingly, the processing gas containing carbon, hydrogen and fluorine is supplied into the chamber 12c. As an example, the processing gas may contain a $H_2$ gas, a $CF_4$ gas, a $CHF_3$ gas and a $NF_3$ gas. As another example, the processing gas may contain a $H_2$ gas, a $CF_4$ gas, a $CH_2F_2$ gas and a $NF_3$ gas. Further, in the process ST8, the chamber 12c is decompressed. Further, a temperature-adjusted coolant is supplied into the path 18f from the chiller unit 24 to maintain the processing target object W1 at the second temperature. Heating by the heater embedded in the electrostatic chuck 20 may also be performed. Furthermore, the first high frequency power is supplied to the lower electrode 18 from the first high frequency power supply 62, and the second high frequency power may be supplied to the lower electrode 18 from the second high frequency power supply 64. By performing the process ST8, plasma of the processing gas is generated within the chamber 12c. The silicon nitride is etched by active species such as ions and/or radicals in this plasma. To elaborate, a portion of the second layer L2 exposed through the opening of the mask MK is etched.

Thereafter, a process ST9 is performed, and a process ST10 is then performed. The process ST9 and the process ST10 are conducted until the etching of the silicon nitride of the process ST8 is ended. In the process ST9, a light emission intensity of CN is detected by the analyzer 72. The detected light emission intensity is sent to the control unit CU.

In the process ST10, it is determined by the control unit CU whether a condition for stopping the process ST8 is satisfied. To be specific, in the process ST10, based on the light emission intensity of the CN detected in the process ST9, it is determined by the control unit CU whether the etching of the silicon nitride has been ended. During the process ST8, the CN is generated as the nitrogen generated by the etching of the silicon nitride is bond with the carbon in the processing gas. The light emission intensity of the CN thus generated is reduced when the etching of the silicon nitride is ended. Thus, based on times series values of the light emission intensity of the CN, it can be determined whether the etching of the silicon nitride has been finished. For example, if the light emission intensity of the CN is decreased at a preset rate during the process ST8 or if an absolute value of a time derivative of the light emission intensity of the CN is increased over a preset value during the process ST8, it can be determined that the etching of the silicon nitride has been ended. Further, the process ST8 may be ended after a lapse of a predetermined time from the beginning thereof.

If it is determined in the process ST10 that the etching of the silicon nitride is not finished yet, the processing from the process ST9 is continued again while performing the process ST8. Meanwhile, if it is determined in the process ST10 that the etching of the silicon nitride has been ended, the process ST8 is ended. If a first cycle of the process ST8 is ended as the second layer L2 is etched, a first layer L1 under the second layer L2 is exposed through the opening of the mask MK, as shown in FIG. 5. Further, the etching rate of the silicon oxide is much lower than the etching rate of the silicon nitride at the temperature (second temperature) of the processing target object W1 during the process ST8. Accordingly, even when the etching of the second layer L2 is ended, the first layer L1 under the second layer L2 is hardly etched.

Thereafter, a process ST11 is performed. The same as in the process ST6, in the process ST11, it is determined by the control unit CU whether the etching of the preset number of layers of the processing target object W1 has been completed. If it is determined in the process ST11 that the present number of layers are not all etched yet, the processing from the process ST2 is repeated. Meanwhile, if it is determined in the process ST11 that the etching of all the preset number of layers of the processing target object W1 is completed, the method MT is ended. As a result, the pattern of the mask MK is transcribed to the preset number of layers of the processing target object W1. By way of example, as illustrated in FIG. 6, the pattern of the mask MK is transcribed to all of the first layers L1 and all of the second layers L2.

Figure 7:
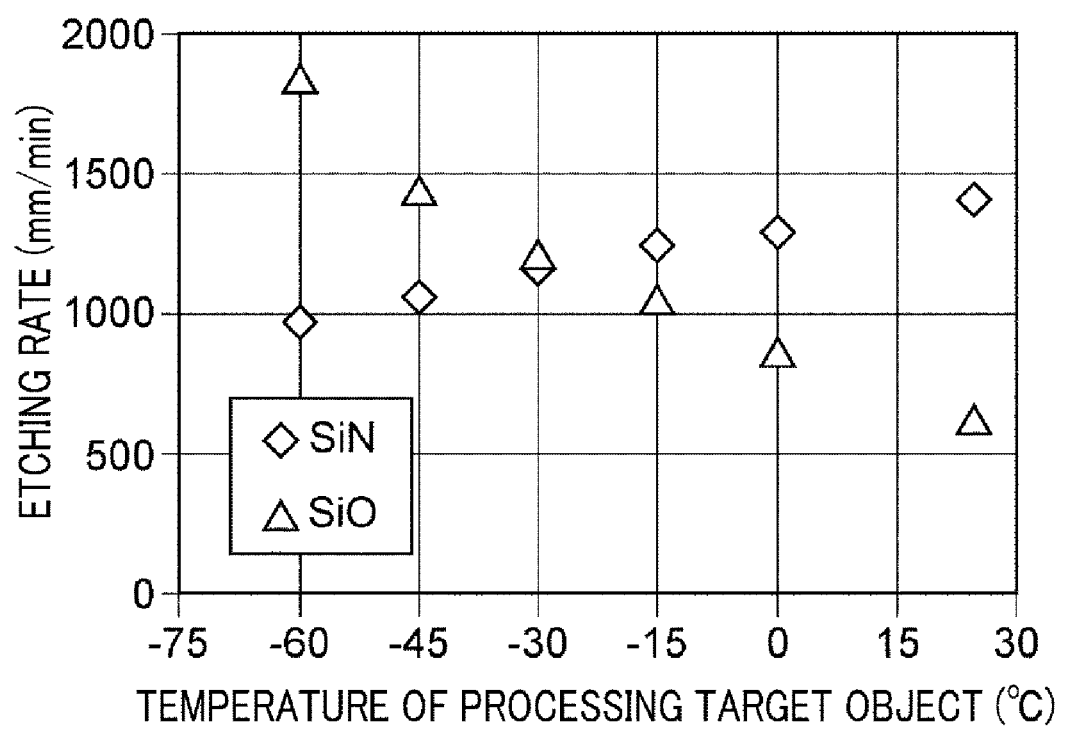
FIG. 7 is a graph showing temperature dependency of an etching rate of the silicon oxide and an etching rate of the silicon nitride.

Now, reference is made to FIG. 7 which presents a graph showing the temperature dependency of the etching rate of silicon oxide and the etching rate of silicon nitride. In FIG. 7, a horizontal axis represents the temperature of the processing target object, whereas a vertical axis represents the etching rate. The etching rate of the silicon oxide shown in FIG. 7 is obtained by etching the silicon oxide film of the processing target object in the plasma processing apparatus 10 while setting different temperatures for the processing target object. Further, the etching rate of the silicon nitride shown in FIG. 7 is acquired by etching the silicon nitride film of the processing target object in the plasma processing apparatus 10 while setting different temperatures for the processing target object. Further, various conditions for etching the silicon oxide film and the silicon nitride film are specified as follows.

<Conditions>

Pressure of chamber 12c: 25 mTorr (3,333 Pa)

First high frequency power: 100 MHz, 2.3 kW

Second high frequency power: 3 MHz, 1 kW

Processing gas: mixed gas of $H_2$ gas, $CF_4$ gas, $CH_2F_2$ gas and $NF_3$ gas As can be seen from FIG. 7, in case that the temperature of the processing target object is set to be lower than −30° C., the etching rate of the silicon oxide is higher than the etching rate of the silicon nitride. Particularly, if the temperature of the processing target object is set to be equal to or lower than −60° C., the etching rate of the silicon oxide is found to be twice as high as the etching rate of the silicon nitride. Further, in case that the temperature of the processing target object is set to be higher than −30° C., the etching rate of the silicon nitride is higher than the etching rate of the silicon oxide. Particularly, if the temperature of the processing target object is set to be equal to or higher than 25° C., the etching rate of the silicon nitride is found to be twice as high as the etching rate of the silicon oxide.

As stated above, the etching rate of the silicon oxide becomes higher than the etching rate of the silicon nitride at a relatively low temperature. Meanwhile, the etching rate of the silicon nitride becomes higher than the etching rate of the silicon oxide at a relatively high temperature. In the method MT, the etching is performed by the plasma of the processing gas in the state that the temperature of the processing target object is set to the first temperature which is relatively low. Accordingly, the silicon oxide is etched selectively with high efficiency against the silicon nitride. Furthermore, in the method MT, the etching is performed by the plasma of the processing gas in the state that the temperature of the processing target object is set to the second temperature which is higher than the first temperature. Accordingly, the silicon nitride is etched selectively with high efficiency against the silicon oxide. Therefore, according to the method MT, it is possible to etch the silicon oxide and the silicon nitride selectively against each other with high efficiency.

Further, in case that the processing target object has a multilayered film, like the processing target object W1 shown in FIG. 2, it is possible to etch the multilayered film efficiently by performing the method MT. Furthermore, according to the method MT, since the silicon oxide and the silicon nitride can be etched selectively against each other, if the mask provides a multiple number of openings in an in-surface direction of the processing target object, until the etching of a same layer under all the openings of the mask is completed, an underlayer of the corresponding same layer can be suppressed from being etched. That is, according to the method MT, the uniformity of the etching within the surface of the processing target object can be improved.

Figure 8:
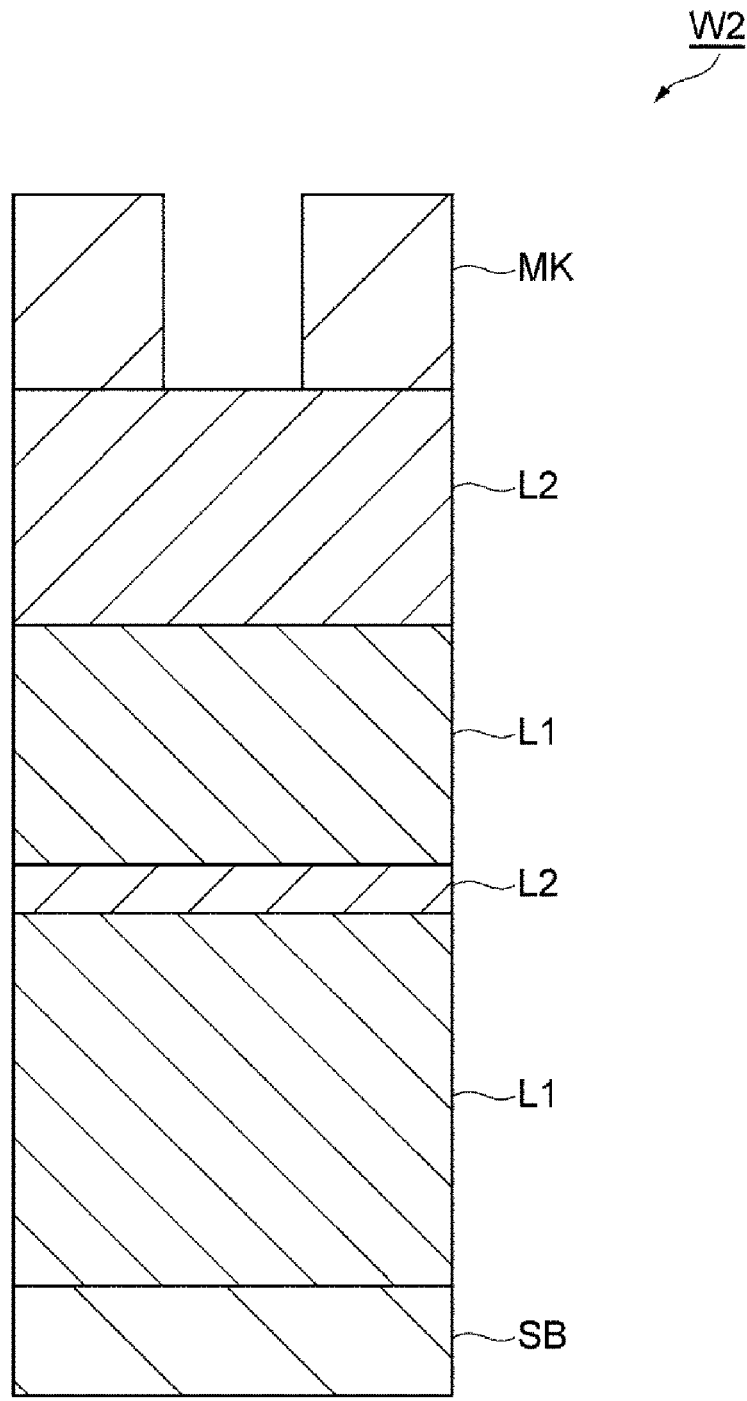
FIG. 8 is an enlarged sectional view illustrating a part of another example processing target object.

Now, reference is made to FIG. 8, which provides an enlarged sectional view of a part of another example processing target object. Like the processing target object W1, a processing target object W2 shown in FIG. 8 includes a plurality of first layers L1 made of silicon oxide and a multiplicity of second layers L2 made of silicon nitride. The first layers L1 and the second layers L2 are alternately stacked on top of each other. That is, the processing target object W2 has a multilayered film composed of the layers made of silicon oxide and the layers made of silicon nitride. In the processing target object W2, however, an uppermost layer of the multilayered film is the second layer L2. In the etching of this processing target object W2, the method MT is modified such that the processes ST7 to ST11 are first performed before the processes ST1 to ST6. That is, the order of performing the processes ST1 to ST6 and the processes ST7 to ST11 of the method MT can be appropriately changed based on the structure of the layers of the processing target object.

Figure 9:
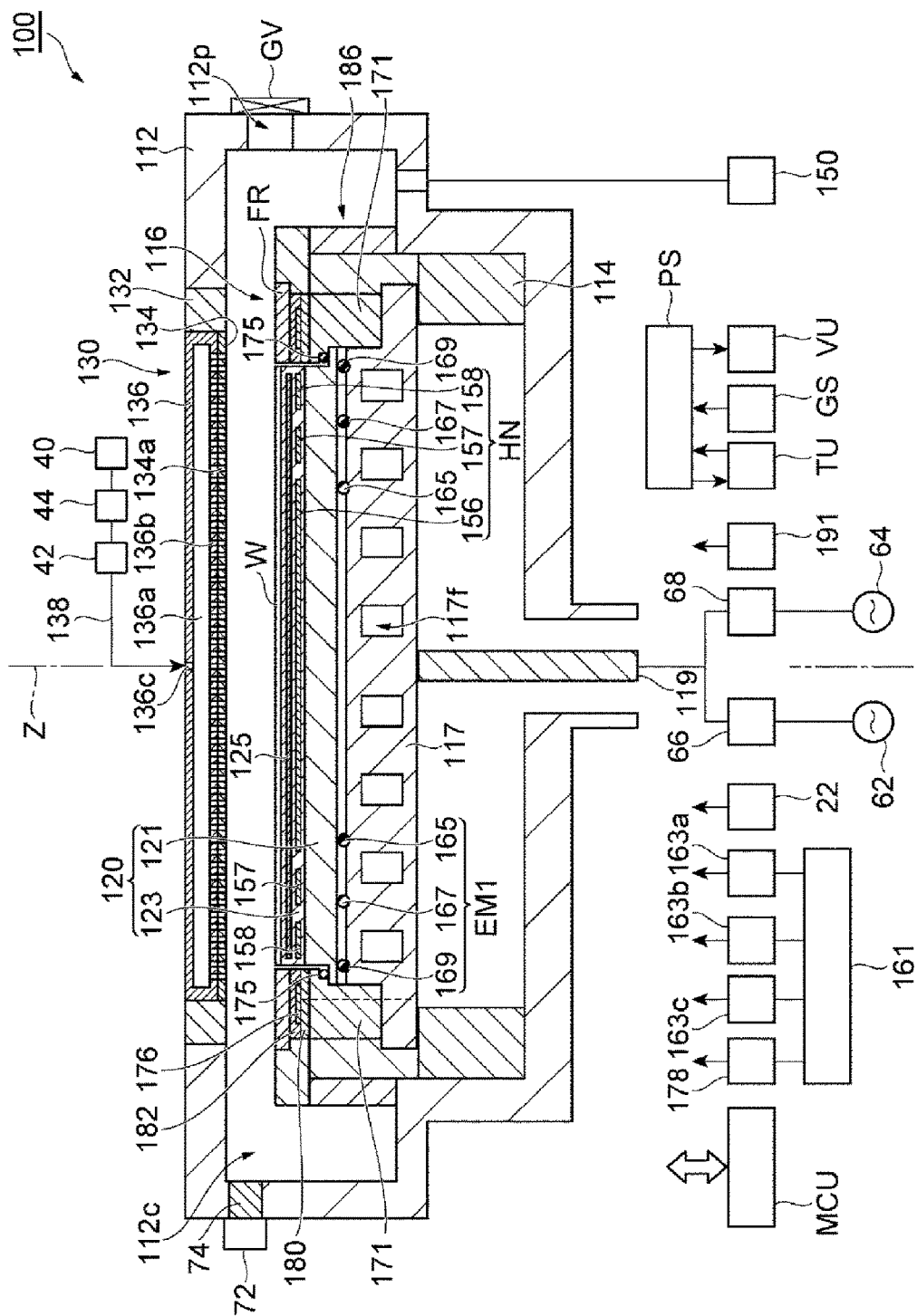
FIG. 9 is a diagram schematically illustrating a plasma processing apparatus according to another exemplary embodiment that can be used in performing the method shown in FIG. 1.

Now, a plasma processing apparatus according to another exemplary embodiment that can be used in performing the method MT will be explained. FIG. 9 is a diagram schematically illustrating the plasma processing apparatus according to another exemplary embodiment that can be used in performing the method shown in FIG. 1. A plasma processing apparatus 100 shown in FIG. 9 is configured as a capacitively coupled plasma processing apparatus. The plasma processing apparatus 100 includes a chamber main body 112 and a mounting table 116. The chamber main body 112 has a substantially cylindrical shape, and an internal space of the chamber main body 112 is configured as a chamber 112c. The chamber main body 112 is made of, by way of example, aluminum. A film made of ceramic such as an alumite film and/or an yttrium oxide film, which has plasma resistance, is formed on an inner surface of the chamber main body 112. The chamber main body 112 is grounded. Further, an opening 112p through which a processing target object W is carried into/out of the chamber 112c is provided at a side wall of the chamber main body 112. This opening 112p is configured to be opened/closed by a gate valve GV.

The mounting table 116 is configured to support the processing target object W within the chamber 112c. The mounting table 116 has a function of attracting the processing target object W and adjusting a temperature of the processing target object W, and has a structure in which a high frequency power is sent to a base of an electrostatic chuck. Details of this mounting table 116 will be discussed later.

The plasma processing apparatus 100 is further equipped with an upper electrode 130. The upper electrode 130 is placed within a top opening of the chamber main body 112 and is arranged to be substantially parallel to a lower electrode of the mounting table 116. An insulating supporting member 132 is provided between the upper electrode 130 and the chamber main body 112.

The upper electrode 130 includes a ceiling plate 134 and a supporting body 136. The ceiling plate 134 has a substantially disk shape. The ceiling plate 134 may have conductivity. Further, the ceiling plate 134 is made of, by way of non-limiting example, silicon. Alternatively, the ceiling plate 134 is made of aluminum, and a ceramic film having plasma resistance is formed on a surface of the ceiling plate 134. The ceiling plate 134 is provided with a multiple number of gas discharge holes 134a. These gas discharge holes 134a are extended in a substantially vertical direction.

The supporting body 136 is configured to support the ceiling plate 134 in a detachable manner, and is made of, by way of non-limiting example, aluminum. A gas diffusion space 136a is formed within the supporting body 136. Multiple holes 136b are extended from the gas diffusion space 136a to communicate with the gas discharge holes 134a, respectively. A pipeline 138 is connected to the gas diffusion space 136a via a port 136c. A gas source group 40 is connected to this pipeline 138 via a valve group 42 and a flow rate controller group 44 in the same way as in the plasma processing apparatus 10.

The plasma processing apparatus 100 is further equipped with a gas exhaust device 150. The gas exhaust device 150 includes one or more pump such as a turbo molecular pump or a dry pump and a pressure control valve. This gas exhaust device 150 is connected to a gas exhaust port formed at the chamber main body 112.

Like the plasma processing apparatus 10, the plasma processing apparatus 100 may be further equipped with an analyzer 72. The analyzer 72 is configured to perform spectroscopic analysis of plasma generated within the chamber 112c. By way of example, the analyzer 72 observes emission of plasma through a window 74 provided at the side wall of the chamber main body 112. The window 74 is made of a transparent member such as quartz. The analyzer 72 detects at least a light emission intensity of CO and a light emission intensity of CN. The emitted light of CO has a wavelength of about 483 nm, and the emitted light of CN has a wavelength of about 387 nm.

The plasma processing apparatus 100 further includes a control unit MCU. The control unit MCU has the same configuration as the control unit CU of the plasma processing apparatus 10. Recipe data and a control program for controlling various processings performed in the plasma processing apparatus 100 by the processor are stored in a storage unit of the control unit MCU. By way of example, recipe data and control programs for implementing the method MT in the plasma processing apparatus 100 are stored in the storage unit of the control unit MCU.

Figure 10:
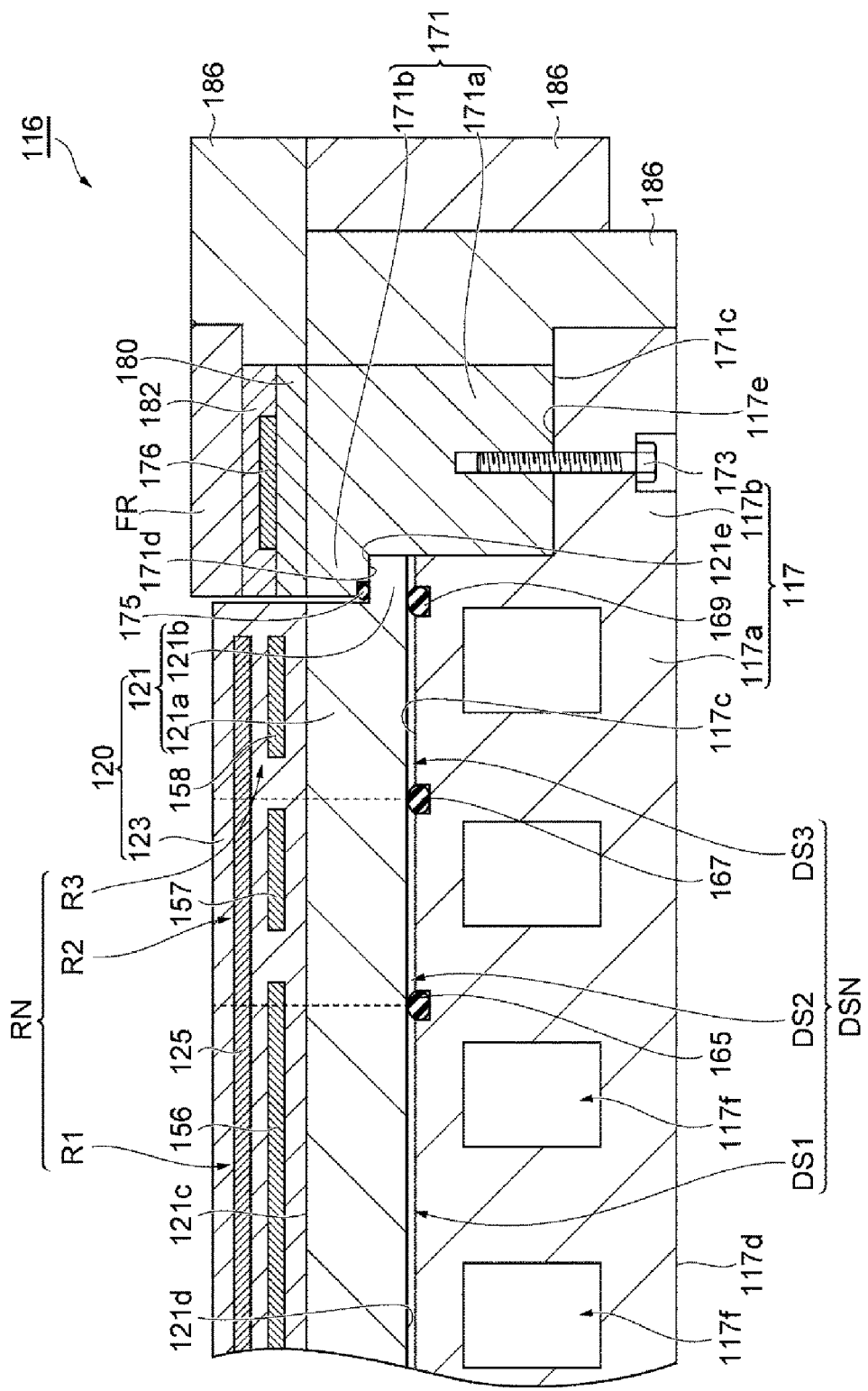
FIG. 10 is an enlarged sectional view illustrating a part of a mounting table of the plasma processing apparatus shown in FIG. 9.
Figure 11:
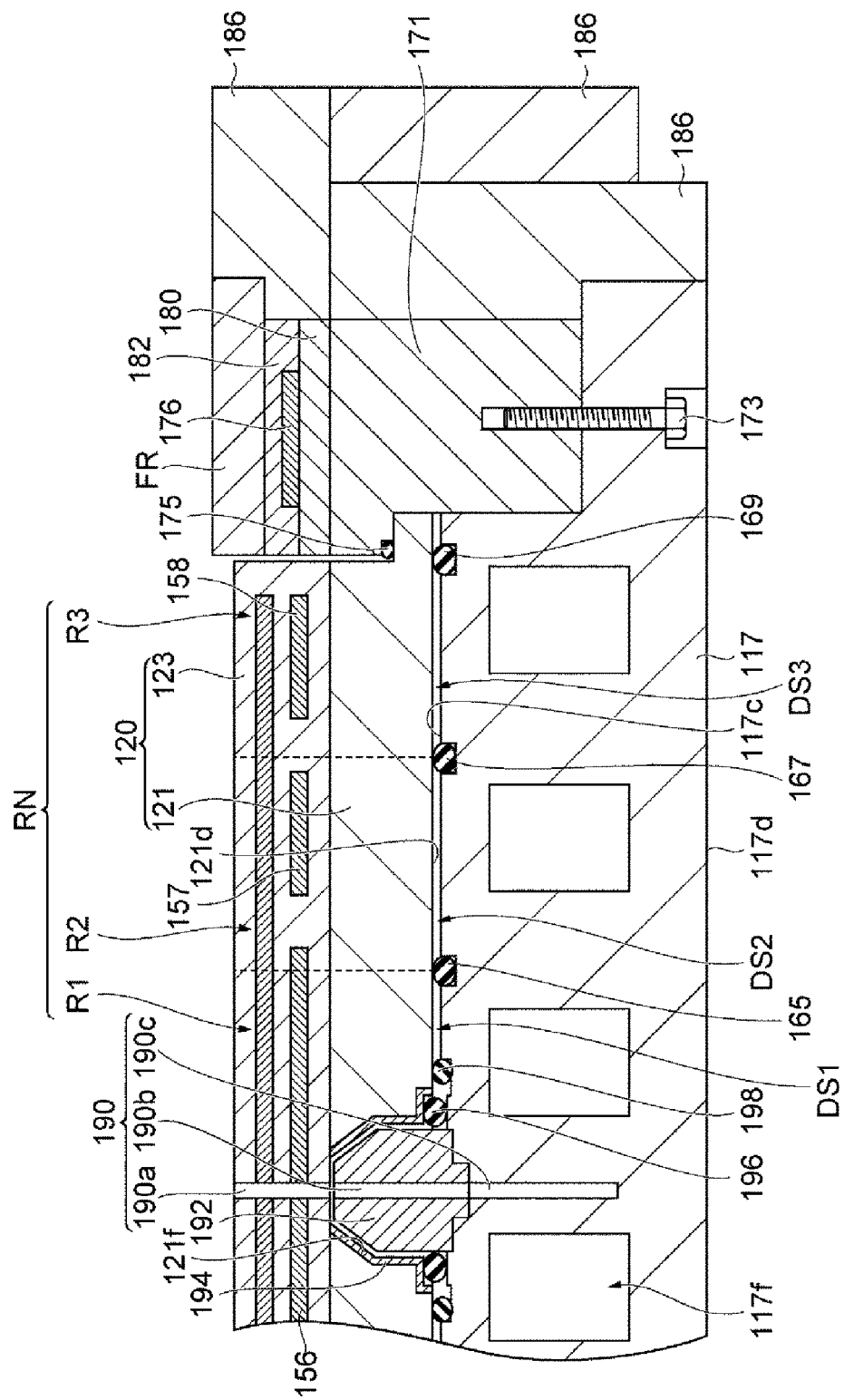
FIG. 11 is an enlarged sectional view illustrating another part of the mounting table of the plasma processing apparatus shown in FIG. 9.

Now, with reference to FIG. 10 and FIG. 11 in addition to FIG. 9, the mounting table 116 and constituent components of the plasma processing apparatus 100 belonging to the mounting table 116 will be discussed in detail. FIG. 10 is an enlarged sectional view illustrating a part of the mounting table of the plasma processing apparatus shown in FIG. 9, and FIG. 11 is an enlarged sectional view illustrating another part of the mounting table of the plasma processing apparatus illustrated in FIG. 9.

The mounting table 116 includes a cooling table 117 and an electrostatic chuck 120. The cooling table 117 is supported by a supporting member 114 upwardly extended from a bottom portion of the chamber main body 112. This supporting member 114 is implemented by an insulating member and is made of, by way of non-limiting example, aluminum oxide (alumina). Further, the supporting member 114 has a substantially cylindrical shape.

The cooling table 117 is made of a conductive metal, for example, aluminum. The cooling table 117 has a substantially disk shape. The cooling table 117 has a central portion 117a and a peripheral portion 117b. The central portion 117a has a substantially disk shape. The central portion 117a provides a first top surface 117c of the cooling table 117. The first top surface 117c is of a substantially circular shape.

The peripheral portion 117b is continuous with the central portion 117a, and is extended in a circumferential direction (a circumferential direction with respect to a vertically extended axis line Z) at an outside of the central portion 117a in a diametric direction (a radial direction with respect to the axis line Z). In the present exemplary embedment, the peripheral portion 117b provides a bottom surface 117d of the cooling table 117 along with the central portion 117a. Further, the peripheral portion 117b provides a second top surface 117e. The second top surface 117e is a band-shaped surface, and is located outside the first top surface 117c in the diametric direction and extended in the circumferential direction. Further, in the vertical direction, the second top surface 117e is located closer to the bottom surface 117d than the first top surface 117c is.

The cooling table 117 is connected with a power feed body 119. The power feed body 119 is, by way of example, a power feed rod and is connected to the bottom surface 117d of the cooling table 117. The power feed body 119 is made of aluminum or an aluminum alloy. The power feed body 119 is connected to a first high frequency power supply 62 via a matching device 66. Further, the power feed body 119 is electrically connected with a second high frequency power supply 64 via a matching device 68.

The cooling table 117 is provided with a path 117f for a coolant. The path 117f is extended in, for example, a spiral shape within the cooling table 117. The coolant is supplied into the path 117f from a chiller unit TU. In this exemplary embodiment, the coolant supplied into the path 117f may be of a type in which heat is absorbed by vaporization thereof to perform cooling. This coolant may be, for example, a hydrofluorocarbon-based coolant.

The electrostatic chuck 120 is provided on the cooling table 117. To elaborate, the electrostatic chuck 120 is provided on the first top surface 117c of the cooling table 117. The electrostatic chuck 120 has a base 121 and an attracting member 123. The base 121 constitutes a lower electrode and is provided on the cooling table 117. The base 121 has conductivity. By way of example, the base 121 may be made of ceramic such as aluminum nitride or silicon carbide having conductivity, or made of a metal (e.g., titanium).

The base 121 has a substantially disk shape. The base 121 has a central portion 121a and a peripheral portion 121b. The central portion 121a has a substantially disk shape. The central portion 121a provides a first top surface 121c of the base 121. The first top surface 121c is of a substantially circular shape.

The peripheral portion 121b is continuous with the central portion 121a and is extended in a circumferential direction at an outside of the central portion 121a in a diametric direction. In the present exemplary embedment, the peripheral portion 121b provides a bottom surface 121d of the base 121 along with the central portion 121a. Further, the peripheral portion 121b provides a second top surface 121e. The second top surface 121e is a band-shaped surface and extended in the circumferential direction at an outside of the first top surface 121c in the diametric direction. Further, in the vertical direction, the second top surface 121e is located closer to the bottom surface 121d than the first top surface 121c is.

The attracting member 123 is provided on the base 121. The attracting member 123 is coupled to the base 121 by metal bonding with a metal provided between the attracting member 123 and the base 121. The attracting member 123 has a substantially disk shape and is made of ceramic. The ceramic forming the attracting member 123 may be one having a volume resistivity of $1\times10^{15}$ Ω·cm or more in a temperature range from a room temperature (e.g., 20° C.) to 400° C. As an example of this ceramic, aluminum oxide (alumina) may be used.

The electrostatic chuck 120 includes a plurality of concentric regions RN with respect to the axis line Z, that is, a central axis line of the electrostatic chuck 120. In the exemplary embodiment, the electrostatic chuck 120 includes a first region R1, a second region R2 and a third region R3. The first region R1 intersects with the axis line Z, and the third region R3 is a region including an edge of the electrostatic chuck 120. The second region R2 is located between the first region R1 and the third region R3. As an example, the first region R1 ranges up to a radius of 120 mm from a center of the electrostatic chuck 120; the second region R2 ranges from the radius of 120 mm to a radius of 135 mm of the electrostatic chuck 120; and the third region R3 ranges from the radius of 135 mm to a radius of 150 mm of the electrostatic chuck 120. Further, the number of the regions of the electrostatic chuck 120 may be equal to or larger than 1.

The attracting member 123 of the electrostatic chuck 120 has an attraction electrode 125 embedded therein. The attraction electrode 125 is a film-shaped electrode and electrically connected with a DC power supply 22. If a DC voltage is applied to the attraction electrode 125 from the DC power supply 22, the attracting member 123 generates an electrostatic force such as a Coulomb force to hold the processing target object W with this electrostatic force.

The attracting member 123 is additionally equipped with a multiple number of heaters HN. These heaters HN are respectively provided in the multiple regions RN of the electrostatic chuck. In the exemplary embodiment, the multiple heaters HN include a first heater 156, a second heater 157 and a third heater 158. The first heater 156 is provided in the first region R1; the second heater 157, in the second region R2; and the third heater 158, in the third region R3.

The individual heaters HN are connected to a heater power supply 161. In the present exemplary embodiment, a filter 163a is provided between the first heater 156 and the heater power supply 161 to suppress the high frequency power from being introduced into the heater power supply 161. A filter 163b is provided between the second heater 157 and the heater power supply 161 to suppress the high frequency power from being introduced into the heater power supply 161. Further, a filter 163c is provided between the third heater 158 and the heater power supply 161 to suppress the high frequency power from being introduced into the heater power supply 161.

Multiple first elastic members EM1 are provided between the base 121 and the cooling table 117. The first elastic members EM1 are configured to allow the electrostatic chuck 120 to be upwardly spaced from the cooling table 117. Each of the first elastic members EM1 is an O-ring. The individual first elastic members EM1 have different diameters and are arranged concentrically with respect to the axis line Z. Further, the first elastic members EM1 are located under boundaries between the adjacent regions of the electrostatic chuck 120 and under the edge of the electrostatic chuck 120. In the present exemplary embodiment, the first elastic members EM1 include an elastic member 165, an elastic member 167 and an elastic member 169. The elastic member 165 is provided under a boundary between the first region R1 and the second region R2; the elastic member 167, under a boundary between the second region R2 and the third region R3; and the elastic member 169, under the edge of the electrostatic chuck 120.

The individual first elastic member EM1 are partially placed in grooves provided on the first top surface 117c of the cooling table 117 and in contact with the first top surface 117c and the bottom surface 121d of the base 121. These first elastic members EM1 define, along with the cooling table 117 and the base 121, a plurality of heat transfer spaces DSN between the first top surface 117c of the cooling table 117 and the bottom surface 121d of the base 121. These heat transfer spaces DSN are respectively extended under the regions RN of the electrostatic chuck 120 and separated from each other. In the exemplary embodiment, the heat transfer spaces DSN include a first heat transfer space DS1, a second heat transfer space DS2 and a third heat transfer space DS3. The first heat transfer space DS1 is located inside the elastic member 165; the second heat transfer space DS2, between the elastic member 165 and the elastic member 167; and the third heat transfer space DS3, between the elastic member 167 and the elastic member 169. As will be described later, a gas source GS of a heat transfer gas (for example, a He gas), a chiller unit TU and a gas exhaust device VU are connected to the heat transfer spaces DSN selectively via a pipeline system PS. Further, a length of each heat transfer space DSN in a vertical direction is set to be in a range from, but not limited to, 0.1 mm to 2.0 mm.

In the present exemplary embodiment, each of the first elastic members EM1 has heat resistivity higher than heat resistivity of each of the heat transfer spaces DSN in which the He gas is supplied. The heat resistivity of each heat transfer space DSN depends on a heat conductivity of the heat transfer gas, a length of the corresponding heat transfer space DSN in the vertical direction and an area thereof.

Further, the heat resistivity of each first elastic member EM1 depends on a heat conductivity of the corresponding first elastic member EM1, a thickness of the corresponding first elastic member EM1 in the vertical direction and an area thereof. Thus, a material, the thickness and the area of each of the first elastic members EM1 are determined based on the heat resistivity of the corresponding heat transfer space DSN. Furthermore, the first elastic members EM1 may be required to have low heat conductivity and high heat resistance. Thus, the first elastic members EM1 may be formed of, by way of non-limiting example, perfluoroelastomer.

The mounting table 116 may be further equipped with a fastening member 171. The fastening member 171 is made of a metal and is configured to clamp the base 121 and the first elastic members EM1 between the fastening member 171 and the cooling table 117. The fastening member 171 is made of a material having low heat conductivity, for example, titanium to suppress heat conduction between the base 121 and the cooling table 117 through the fastening member 171.

In the present exemplary embodiment, the fastening member 171 has a cylindrical portion 171a and an annular portion 171b. The cylindrical portion 171a has a substantially cylindrical shape, and has a first bottom surface 171c at a bottom end thereof. The first bottom surface 171c is a band-shaped surface extended in the circumferential direction thereof.

The annular portion 171b has a substantially annular plate shape and is extended from the cylindrical portion 171a inwardly in the diametric direction to be continuous with an upper inner periphery of the cylindrical portion 171a. This annular portion 171b provides a second bottom surface 171d. The second bottom surface 171d is a band-shaped surface extended in the circumferential direction thereof.

The fastening member 171 is placed such that the first bottom surface 171c is in contact with the second top surface 117e of the cooling table 117 and the second bottom surface 171d is in contact with the second top surface 121e of the base 121. Further, the fastening member 171 is fixed to the peripheral portion 117b of the cooling table 117 by a screw 173. By adjusting screwing of this screw 173 into the fastening member 171, a pressed amount of the first elastic members EM1 is adjusted, so that the length of the heat transfer spaces DSN in the vertical direction is adjusted.

In the exemplary embodiment, a second elastic member 175 is provided between a bottom surface of an inner peripheral portion of the annular portion 171b of the fastening member 171 and the second top surface 121e of the base 121. The second elastic member 175 is implemented by an O-ring and is configured to suppress a particle (e.g., metal powder) that might be generated by a friction between the second bottom surface 171d of the fastening member 171 and the second top surface 121e of the base 121 from being moved toward a side of the attracting member 123.

Furthermore, the second elastic member 175 generates a reaction force smaller than a reaction force generated by the first elastic members EM1. That is, the first elastic members EM1 are configured such that the reaction force generated by the first elastic members EM1 is larger than the reaction force generated by the second elastic member 175. In addition, this second elastic member 175 may be made of a material having high heat resistance and low heat conductivity, for example, perfluoroelastomer.

A heater 176 is provided on the fastening member 171. This heater 176 is extended in the circumferential direction and connected to a heater power supply 161 via a filter 178.

The filter 178 is provided to suppress the high frequency power from being introduced into the heater power supply 161.

The heater 176 is provided between a first film 180 and a second film 182. The first film 180 is located closer to the fastening member 171 than the second film 182 is. The first film 180 has heat conductivity lower than that of the second film 182. By way of example, the first film 180 may be a thermally sprayed zirconia-based film, and the second film 182 may be a thermally sprayed yttrium oxide (yttria)-based film. Further, the heater 176 may be a thermally sprayed tungsten film.

A focus ring FR is provided on the second film 182. The focus ring FR is heated by heat from the heater 176. Further, most of heat flux from the heater 176 flows toward the second film 182 than the first film 180, and flow toward the focus ring FR through the second film 182. Accordingly, the focus ring FR is efficiently heated.

Furthermore, outer side surfaces of the fastening member 171 and the cooling table 117 of the mounting table 116 and so forth are covered with one or more insulating members 186. The one or more insulating members 186 may be made of, by way of example, but not limitation, aluminium oxide or quartz.

In addition, as illustrated in FIG. 11 a gas line 190 through which the heat transfer gas (e.g., He gas) is supplied into a gap between the processing target object W and the attracting member 123 is provided in the cooling table 117 and the electrostatic chuck 120 of the mounting table 116. The gas line 190 is connected to a heat transfer gas supply unit 191.

As depicted in FIG. 11, the gas line 190 includes a gas line 190a, a gas line 190b and a gas line 190c. The gas line 190a is formed in the attracting member 123. Further, the gas line 190c is formed in the cooling table 117. The gas line 190a and the gas line 190c are connected to each other with the gas line 190b therebetween. The gas line 190b is implemented by a sleeve 192. This sleeve 192 is a substantially cylindrical member, and at least a surface thereof has insulation property. This surface of the sleeve 192 is made of ceramic. As an example, the sleeve 192 is made of insulating ceramic. By way of example, the sleeve 192 is made of aluminium oxide (alumina). As another example, the sleeve 192 may be implemented by a metal member having thereon a surface on which insulation treatment is performed. For example, the sleeve 192 may have a main body made of aluminium and an alumite film formed on a surface of the main body.

In the base 121 and the cooling table 117, an accommodation space for accommodating the sleeve 192 is formed. A film 194 made of insulating ceramic is formed on a surface 121f of the base 121 which partitions and forms this accommodation space. The film 194 may be, by way of example, but not limitation, a thermally sprayed aluminium oxide (alumina) film.

A third elastic member 196 is provided between the film 194 and the cooling table 117 to hermetically seal the accommodation space of the sleeve 192. The third elastic member 196 is implemented by an O-ring and has insulation property. The third elastic member 196 may be made of, by way of non-limiting example, perfluoroelastomer. Further, a fourth elastic member 198 is provided at an outside of the third elastic member 196. The fourth elastic member 198 is an O-ring and in contact with the first top surface 117c of the cooling table 117 and the bottom surface 121d of the base 121 while sealing the heat transfer space (for example, the first heat transfer space DS1). The fourth elastic member 198 may be made of, by way of example, but not limitation, perfluoroelastomer.

As stated above, in the mounting table 116, the cooling table 117 and the base 121 are spaced apart from each other by the first elastic members EM1. Further, in this mounting table 116, no adhesive is used to couple the base 121 and the attracting member 123. Accordingly, the temperature of the electrostatic chuck 120 can be set to be high. Further, since heat transfer between the electrostatic chuck 120 and the cooling table 117 is achieved through the heat transfer gas supplied into the heat transfer spaces DSN, it is also possible to set the temperature of the electrostatic chuck 120 to be low. Furthermore, in this mounting table 116, a power feed route for the high frequency power to the base 121 of the electrostatic chuck 120 is secured by the power feed body 119, the cooling table 117 and the fastening member 171. Moreover, since the power feed body 119 is not directly connected to the base 121 of the electrostatic chuck 120 but connected to the cooling table 117, aluminium or an aluminium alloy can be used as a material for the power feed body 119. Accordingly, even in case of supplying the high frequency power of the high frequency equal to or higher than 13.56 MHz, a loss of the high frequency power in the power feed body 119 is suppressed.

In addition, as described above, in the exemplary embodiment, the second elastic member 175 is provided between the bottom surface of the inner peripheral portion of the annular portion 171b of the fastening member 171 and the second top surface 121e of the base 121. Since the second top surface 121e of the peripheral portion 121b of the base 121 and the second bottom surface 171d of the fastening member 171 are in contact with each other, friction is generated at the contact point therebetween, so that the particle (e.g., metal powder) may be generated thereat. Even when this particle is generated, the second elastic member 175 suppresses the particle from adhering to the attracting member 123 and the processing target object W placed on the corresponding attracting member 123.

Further, the first elastic members EM1 are configured such that the reaction force generated by these first elastic members EM1 is larger than the reaction force generated by the second elastic member 175. Accordingly, the electrostatic chuck 120 can be securely spaced from the cooling table 117.

Furthermore, in the exemplary embodiment, each of the first elastic members EM1 is configured to have the heat resistance higher than the heat resistance of the corresponding heat transfer space DSN when the He gas is supplied in the corresponding heat transfer space DSN. Further, these first elastic members EM1 are made of, by way of example, perfluoroelastomer. With these first elastic members EM1, the heat conduction through the heat transfer spaces DSN is more dominant than heat conduction through the first elastic members EM1 between the electrostatic chuck 120 and the cooling table 117. Thus, the temperature distribution of the electrostatic chuck 120 can be uniformed.

Additionally, in the exemplary embodiment, the gas line 190 for the heat transfer gas supplied into the gap between the processing target object W and the attracting member 123 is formed without using any adhesive. Further, the surface 121f of the base 121, which forms the accommodation space in which the sleeve 192 as a part of the gas line 190 is placed, is covered with the film 194, and the third elastic member 196 having the insulation property is provided between the film 194 and the cooling table 117 to seal the corresponding accommodation space. With this configuration the introduction of the plasma into the gap between the base 121 and the cooling table 117 and a resultant dielectric breakdown of the base 121 can be supressed.

Furthermore, according to the plasma processing apparatus 100 having the above-described mounting table 116, a plasma processing can be performed on the processing target object W in a wide temperature range from a low temperature to a high temperature.

Figure 12:
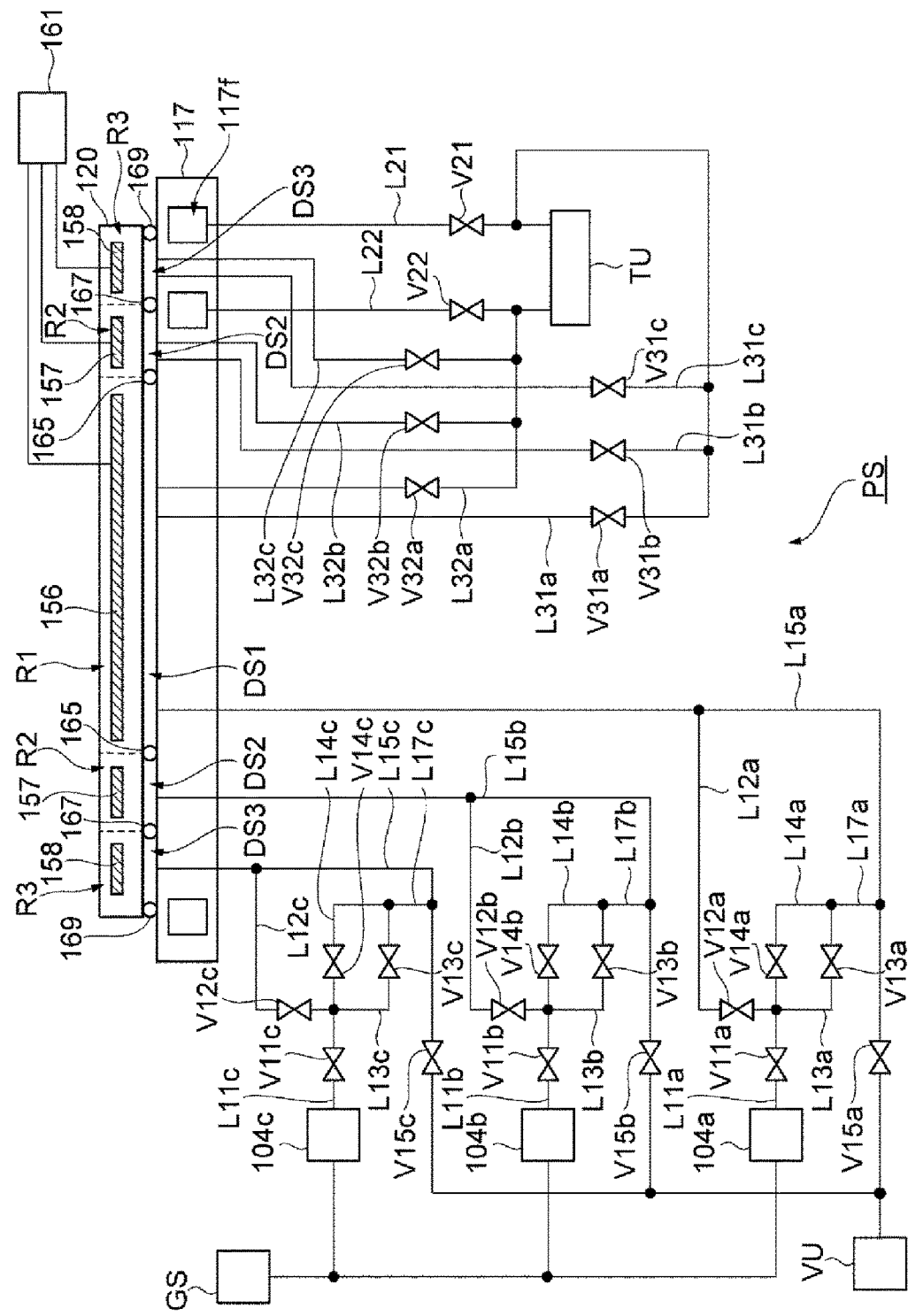
FIG. 12 is a diagram illustrating a pipeline system according to the exemplary embodiment.

Now, a pipeline system PS that can be adopted in the plasma processing apparatus 100 will be explained. FIG. 12 is a diagram illustrating a pipeline system according to the exemplary embodiment. The pipeline system PS shown in FIG. 12 has a multiple number of valves. The pipeline system PS is configured to connect the gas source GS, the chiller unit TU and the gas exhaust device VU selectively to each of the heat transfer spaces DSN and to switch a connection and a disconnection between the chiller unit TU and the path 117f. Below, the description will be provided for the example where the heat transfer spaces DSN include three heat transfer spaces (the first heat transfer space DS1, the second heat transfer space DS2, and the third heat transfer space DS3). Here, however, it should be noted that the number of the heat transfer spaces DSN may not be particularly limited, and may be one or more as long as the number of the heat transfer spaces DSN corresponds to the number of the regions RN of the electrostatic chuck 120.

The pipeline system PS includes a line L21, a line L22, a valve V21 and a valve V22. One end of the line L21 is connected to the chiller unit TU, and the other end of the line L21 is connected to the path 117f. The valve V21 is provided at a part of the line L21. One end of the line L22 is connected to the chiller unit TU, and the other end of the line L22 is connected to the path 117f. The valve V22 is provided at a part of the line L22. If the valve V21 and the valve V22 are opened, the coolant is supplied from the chiller unit TU into the path 117f through the line L21. The coolant supplied into the path 117f is returned back into the chiller unit TU through the line L22.

Further, the pipeline system PS further includes a pressure controller 104a, a line L11a, a line L12a, a line L13a, a line L14a, a line L15a, a line L17a, a line L31a, a line L32a, a valve V11a, a line V12a, a valve V13a, a vale V14a, a valve V15a, a valve V31a and a valve V32a.

The pressure controller 104a is connected to the gas source GS. One end of the line L11a is connected to the pressure controller 104a. The valve V11a is provided at a part of the line L11a. One end of the line L15a is connected to the first heat transfer space DS1, and the other end of the line L15a is connected to the gas exhaust device VU. The valve V15a is provided at a part of the line L15a.

One end of the line L12a is connected to the other end of the line L11a. The other end of the line L12a is connected to a part of the line L15a on the side of the first heat transfer space DS1 with respect to the valve V15a. The valve V12a is provided at a part of the line L12a. One end of the line L13a and one end of the line L14a are also connected to the other end of the line L11a. The valve V13a is provided at a part of the line L13a, and the valve V14a is provided at a part of the line L14a. The other end of the line L13a and the other end of the line L14a are connected to each other. One end of the line L17a is connected to a connection point between the other end of the line L13a and the other end of the line L14a. The other end of the line L17a is connected to the line L15a at a position closer to the valve V15a than the other end of the line L12a is close to the valve V15a.

One end of the line L31a is connected to a part of the line L21 on the side of the chiller unit TU with respect to the valve V21. The other end of the line L31a is connected to the first heat transfer space DS1. The valve V31a is provided at a part of the line L31a. One end of the line L32a is connected to a part of the line L22 on the side of the chiller unit TU with respect to the valve V22. The other end of the line L32a is connected to the first heat transfer space DS1. The valve V32a is provided at a part of the line L32a.

Further, the pipeline system PS additionally includes a pressure controller 104b, a line L11b, a line L12b, a line L13b, a line L14b, a line L15b, a line L17b, a line L31b, a line L32b, a valve V11b, a valve V12b, a valve V13b, a valve V14b, a valve V15b, a valve V31b and a valve V32b.

The pressure controller 104b is connected to the gas source GS. One end of the line L11b is connected to the pressure controller 104b. The valve V11b is provided at a part of the line L11b. One end of the line L15b is connected to the second heat transfer space DS2, and the other end of the line L15b is connected to the gas exhaust device VU. Further, the valve V15b is provided at a part of the line L15b.

One end of the line L12b is connected to the other end of the line L11b. The other end of the line L12b is connected to a part of the line L15b on the side of the second heat transfer space DS2 with respect to the valve V15b. The valve V12b is provided at a part of the line L12b. One end of the line L13b and one end of the line L14b are also connected to the other end of the line L11b. The valve V13b is provided at a part of the line L13b, and the valve V14b is provided at a part of the line L14b. The other end of the line L13b and the other end of the line L14b are connected to each other. One end of the line L17b is connected to a connection point between the other end of the line L13b and the other end of the line L14b. The other end of the line L17b is connected to the line L15b at a position closer to the valve V15b than the other end of the line L12b is close to the valve V15b.

One end of the line L31b is connected to a part of the line L21 on the side of the chiller unit TU with respect to the valve V21. The other end of the line L31b is connected to the second heat transfer space DS2. The valve V31b is provided at a part of the line L31b. One end of the line L32b is connected to a part of the line L22 on the side of the chiller unit TU with respect to the valve V22. The other end of the line L32b is connected to the second heat transfer space DS2. The valve V32b is provided at a part of the line L32b.

Further, the pipeline system PS further includes a pressure controller 104c, a line L11c, a line L12c, a line L13c, a line L14c, a line L15c, a line L17c, a line L31c, a line L32c, a valve V11c, a valve V12c, a valve V13c, a valve V14c, a valve V15c, a valve V31c and a valve V32c.

The pressure controller 104c is connected to the gas source GS. One end of the line L11c is connected to the pressure controller 104c. The valve V11c is provided at a part of the line L11c. One end of the line L15c is connected to the third heat transfer space DS3, and the other end of the line L15c is connected to the gas exhaust device VU. Further, the valve V15c is provided at a part of the line L15c.

One end of the line L12c is connected to the other end of the line L11c. The other end of the line L12c is connected to a part of the line L15c on the side of the third heat transfer space DS3 with respect to the valve V15c. The valve V12c is provided at a part of the line L12c. One end of the line L13c and one end of the line L14c are also connected to the other end of the line L11c. The valve V13c is provided at a part of the line L13c, and the valve V14c is provided at a part of the line L14c. The other end of the line L13c and the other end of the line L14c are connected to each other. One end of the line L17c is connected to a connection point between the other end of the line L13c and the other end of the line L14c.

The other end of the line L17c is connected to the line L15c at a position closer to the valve V15c than the other end of the line L12c is close to the valve V15c.

One end of the line L31c is connected to a part of the line L21 on the side of the chiller unit TU with respect to the valve V21. The other end of the line L31c is connected to the third heat transfer space DS3. The valve V31c is provided at a part of the line L31c. One end of the line L32c is connected to a part of the line L22 on the side of the chiller unit TU with respect to the valve V22. The other end of the line L32c is connected to the third heat transfer space DS3. The valve V32c is provided at a part of the line L32c.

Now, the method MT will be discussed for an example case where the method MT is applied to the processing target object W1 shown in FIG. 2 by using the plasma processing apparatus 100. Even in case of using this plasma processing apparatus 100, the method MT may also be applied to another type of processing target object such as the processing target object W2 shown in FIG. 8. When the method MT is applied to the processing target object W2 by using the plasma processing apparatus 100, the processes ST7 to ST11 are first performed prior to the processes ST1 to ST6.

When the plasma processing apparatus 100 is used, the processing target object W1 is prepared within the chamber 112c in the process ST1 of the method MT. The processing target object W1 is placed on and held by the electrostatic chuck 120.

Figure 13:
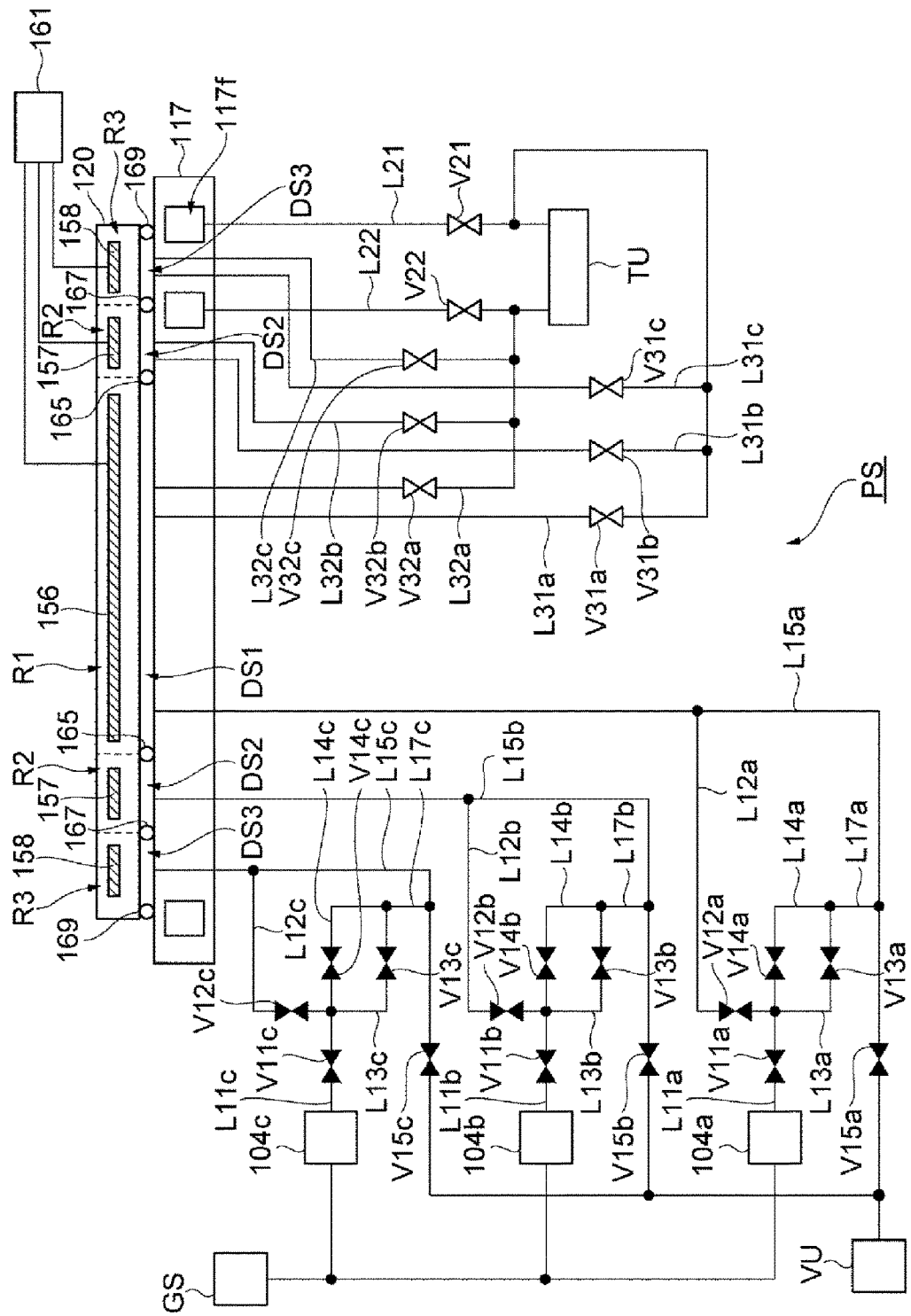
FIG. 13 is a diagram illustrating a state of the pipeline system of the plasma processing apparatus shown in FIG. 9 in an example process ST2.

In the subsequent process ST2, the temperature of the processing target object W1 is lowered. In the process ST2, the individual components of the plasma processing apparatus 100 are controlled in response to signals from the control unit MCU. FIG. 13 is a diagram illustrating a state of the pipeline system of the plasma processing apparatus shown in FIG. 9 in an example of the process ST2. In this example process ST2, as shown in FIG. 13, the heater power supply 161 is controlled to stop the power supply to the multiple number of heaters HN. Further, the temperature of the coolant supplied from the chiller unit TU is adjusted. The valves of the pipeline system PS are controlled such that the coolant is circulated between the path 117f and the chiller unit TU, and the chiller unit TU is connected to the heat transfer spaces DSN. To elaborate, the valve V21, the valve V22, the valve V31a, the valve V32a, the valve V31b, the valve V32b, the valve V31c and the valve V32c are opened, while the other valves of the pipeline system PS are closed. In the state of the pipeline system PS shown in FIG. 13, the multiple number of heaters HN do not generate heat, and the coolant is supplied into the heat transfer spaces DSN and into the path 117f as well. In the state of the pipeline system PS depicted in FIG. 13, the heat resistance of the heat transfer spaces DSN is reduced, so that the temperature of the attracting member 123 of the electrostatic chuck 120 is reduced at a high speed. Accordingly, prior to etching the silicon oxide in the process ST3, the temperature of the processing target object W1 can be reduced at a high speed.

In the subsequent process ST3, the silicon oxide of the processing target object W1 is etched in the state that the temperature of the processing target object W1 is set to the first temperature. In the process ST3, the individual components of the plasma processing apparatus 100 are controlled in response to the signals from the control unit MCU. Accordingly, the processing gas containing carbon, hydrogen and fluorine is supplied into the chamber 112c. Further, in the process ST3, the chamber 112c is decompressed. Further, opening/closing states of the valves of the pipeline system PS and the temperature of the coolant supplied from the chiller unit TU are controlled such that the processing target object W1 is maintained at the first temperature. Further, the first high frequency power is supplied to the base 121 as the lower electrode from the first high frequency power supply 62. Further, the second high frequency power may be supplied to the base 121 from the second high frequency power supply 64. As a result of performing the process ST3, the plasma of the processing gas is generated within the chamber 112c. The silicon oxide is etched by the active species such as ions and/or radicals in this plasma.

Even in case of using the plasma processing apparatus 100, the subsequent processes ST4, ST5 and ST6 are performed in the same way as in case of using the plasma processing apparatus 10. That is, in the process ST4, the light emission intensity of CO is detected by the analyser 72. In the process ST5, based on the detected light emission intensity of CO, for example, it is determined by the control unit MCU whether the etching of the silicon oxide is ended. In the process ST6, it is determined by the control unit MCU whether the etching of a preset number of layers of the processing target object W1 is completed.

Figure 14:
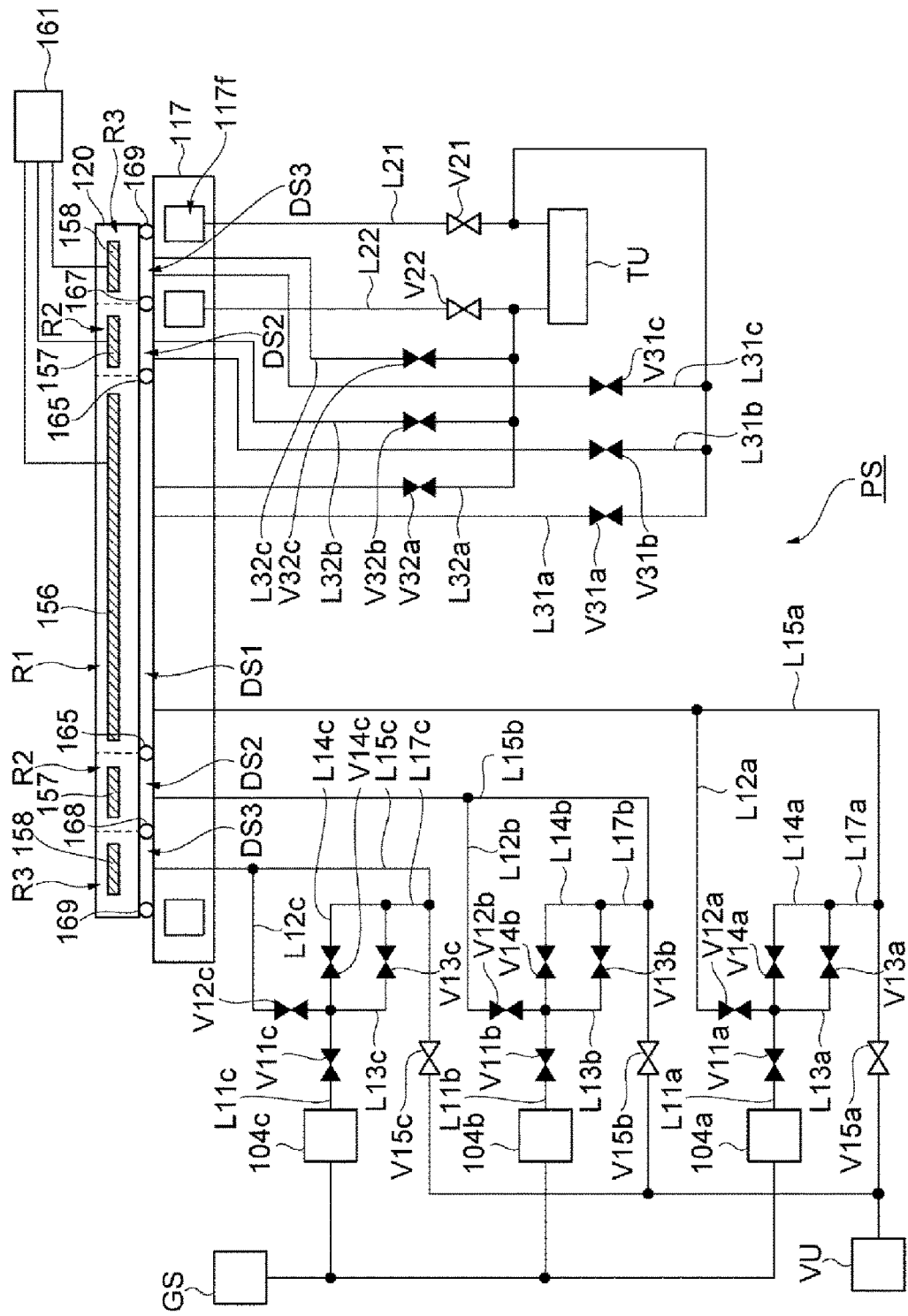
FIG. 14 is a diagram illustrating a state of the pipeline system of the plasma processing apparatus shown in FIG. 9 in an example process ST7.

In the subsequent process ST7, the temperature of the processing target object W1 is raised. In the process ST7, the individual components of the plasma processing apparatus 100 are controlled in response to the signals from the control unit MCU. FIG. 14 is a diagram illustrating a state of the pipeline system of the plasma processing apparatus shown in FIG. 9 in an example of the process ST7. In this example process ST7, as shown in FIG. 14, the heater power supply 161 is controlled to supply the power to the multiple number of heaters HN. Further, the valves of the pipeline system PS are controlled such that the coolant is circulated between the path 117f and the chiller unit TU, and the gas exhaust device VU is connected to the heat transfer spaces DSN. To elaborate, the valve V15a, the valve V15b, the valve V15c, the valve V21 and the valve V22 are opened, while the other valves of the pipeline system PS are closed. In the state of the pipeline system shown in FIG. 14, the heaters HN generate the heat, and the heat transfer spaces DSN are decompressed. In the state of the pipeline system depicted in FIG. 14, the heat resistance of the heat transfer spaces DSN is increased, so that the temperature of the attracting member 123 of the electrostatic chuck 120 is increased at a high speed. Accordingly, prior to etching the silicon nitride in the process ST8, the temperature of the processing target object W1 can be increased at a high speed.

In the subsequent process ST8, the silicon nitride of the processing target object W1 is etched in the state that the temperature of the processing target object W1 is set to the second temperature. In the process ST8, the individual components of the plasma processing apparatus 100 are controlled in response to the signals from the control unit MCU. Accordingly, a processing gas containing carbon, hydrogen and fluorine is supplied into the chamber 112c. Further, in the process ST8, the chamber 112c is decompressed. Further, the opening/closing states of the valves of the pipeline system PS, the heater power supply 161 and the temperature of the coolant supplied from the chiller unit TU are controlled such that the processing target object W1 is maintained at the second temperature. Further, the first high frequency power is supplied to the lower electrode 18 from the first high frequency power supply 62. Further, the second high frequency power may be supplied to the lower electrode 18 from the second high frequency power supply 64. As a result of performing the process ST8, the plasma of the processing gas is generated within the chamber 112c. The silicon nitride is etched by the active species such as ions and/or radicals in this plasma.

Even in case of using the plasma processing apparatus 100, the subsequent processes ST9, ST10 and ST11 are performed in the same way as in case of using the plasma processing apparatus 10. That is, in the process ST9, the light emission intensity of CN is detected by the analyser 72. In the process ST10, based on the detected light emission intensity of CN, for example, it is determined by the control unit MCU whether the etching of the silicon nitride is ended. In the process ST11, it is determined by the control unit MCU whether the etching of a preset number of layers of the processing target object W1 is completed As stated above, according to the plasma processing apparatus 100, the temperature of the processing target object can be decreased or increased at a high speed. Thus, it is possible to etch the silicon oxide and the silicon nitride selectively against each other with higher efficiency. Further, the processing time of the method MT can be reduced.

Although the various exemplary embodiments have been described so far, those exemplary embodiments are not limiting and can be modified in various ways. By way of example, although the above-described plasma processing apparatuses 10 and 100 are configured to be of the capacitively coupled plasma processing apparatus, the method MT and a modification thereof can also be applied to various other types of plasma processing apparatuses such as an inductively coupled plasma processing apparatus, a plasma processing apparatus using a surface wave such as a microwave for the generation of plasma, and so forth.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A method of etching silicon oxide and silicon nitride selectively against each other, the method comprising:
   preparing a processing target object within a chamber provided by a chamber main body of a plasma processing apparatus;
   etching silicon oxide of the processing target object by generating plasma of a processing gas containing carbon, hydrogen and fluorine within the chamber in a state that a temperature of the processing target object is set to a first temperature; and
   etching silicon nitride of the processing target object by generating the plasma of the processing gas containing carbon, hydrogen and fluorine within the chamber in a state that the temperature of the processing target object is set to a second temperature higher than the first temperature,
   wherein an etching rate of the silicon oxide is higher than an etching rate of the silicon nitride at the first temperature, and
   the etching rate of the silicon nitride is higher than the etching rate of the silicon oxide at the second temperature.

2. The method of claim 1,
wherein the processing target object has multiple first layers made of the silicon oxide and multiple second layers made of the silicon nitride,
the multiple first layers and the multiple second layers are alternately stacked on top of each other, and
the etching of the silicon oxide and the etching of the silicon nitride are performed alternately.

3. The method of claim 1,
wherein the first temperature is lower than −30° C., and the second temperature is higher than −30° C.

4. The method of claim 1,
wherein the plasma processing apparatus further comprises an analyzer configured to perform spectroscopic analysis of the plasma within the chamber,
the etching of the silicon oxide is ended when it is determined, based on a light emission intensity of CO (Carbon Oxide) obtained by the analyzer, that the silicon oxide is completely etched, and
the etching of the silicon nitride is ended when it is determined, based on a light emission intensity of CN (Carbon Nitride) obtained by the analyzer, that the silicon nitride is completely etched.

5. The method of claim 1,
wherein the plasma processing apparatus further comprises:
a mounting table which is provided within the chamber and includes a cooling table, which is made of a metal and provided with a path for a coolant formed therein, and an electrostatic chuck, which is provided on the cooling table with a heat transfer space therebetween and provided with a heater therein;
a chiller unit configured to supply the coolant into the path;
a gas exhaust device; and
a pipeline system configured to connect the chiller unit and the gas exhaust device to the heat transfer space selectively,
wherein the method further comprises:
decreasing the temperature of the processing target object by supplying the coolant into the path and the heat transfer space from the chiller unit; and
increasing the temperature of the processing target object by decompressing the heat transfer space with the gas exhaust device and generating heat from the heater,
wherein the etching of the silicon oxide is performed after the temperature of the processing target object is set to the first temperature by performing the decreasing of the temperature of the processing target object, and
the etching of the silicon nitride is performed after the temperature of the processing target object is set to the second temperature by performing the increasing of the temperature of the processing target object.

* * * * *